United States Patent
Tutunoglu et al.

(10) Patent No.: US 9,115,916 B2
(45) Date of Patent: Aug. 25, 2015

(54) METHOD OF OPERATING A COOLING SYSTEM HAVING ONE OR MORE COOLING UNITS

(71) Applicant: SCHNEIDER ELECTRIC IT CORPORATION, West Kingston, RI (US)

(72) Inventors: Ozan Tutunoglu, O'Fallon, MO (US); John H. Bean, Jr., Wentzville, MO (US)

(73) Assignee: SCHNEIDER ELECTRIC IT CORPORATION, West Kingston, RI (US)

( * ) Notice: Subject to any disclaimer, the term of this patent is extended or adjusted under 35 U.S.C. 154(b) by 355 days.

(21) Appl. No.: 13/679,083

(22) Filed: Nov. 16, 2012

(65) Prior Publication Data
US 2013/0139530 A1    Jun. 6, 2013

Related U.S. Application Data

(63) Continuation of application No. 12/137,177, filed on Jun. 11, 2008, now Pat. No. 8,322,155, which is a continuation-in-part of application No. 11/504,370, filed on Aug. 15, 2006, now Pat. No. 8,327,656.

(51) Int. Cl.
*F25B 41/00* (2006.01)
*F25B 49/00* (2006.01)
(Continued)

(52) U.S. Cl.
CPC ............... *F25B 1/00* (2013.01); *F24F 11/0086* (2013.01); *F25B 49/005* (2013.01); *F25B 49/02* (2013.01);
(Continued)

(58) Field of Classification Search
CPC ............ F24F 11/0086; F24F 2011/0091; F25B 49/005; F25B 2500/18; F25B 2500/19; F25B 2600/11; F25B 2600/112; F25B 2600/2501; F25B 2700/13; F25B 2700/1931; F25B 2700/19331

USPC ......... 62/80, 81, 155, 196.1, 196.4, 230, 277, 62/278

See application file for complete search history.

(56) References Cited

U.S. PATENT DOCUMENTS

| | | | |
|---|---|---|---|
| 1,025,243 | A | 5/1912 | Carpenter et al. |
| 1,941,258 | A | 12/1933 | Gordon |

(Continued)

FOREIGN PATENT DOCUMENTS

| | | |
|---|---|---|
| CN | 1485906 A | 3/2004 |
| CN | 2612211 Y | 4/2004 |

(Continued)

OTHER PUBLICATIONS

"Enthalpy" Published by the National Aeronautics and Space Administration and editted by Tom Benson. Retrieved on Jul. 13, 2009 from http://www.grc.nasa.gov/WWW/K-12/airplane/enthalpy.html, pp. 3.

(Continued)

*Primary Examiner* — Mohammad M Ali
*Assistant Examiner* — Daniel C Comings
(74) *Attorney, Agent, or Firm* — Lando & Anastasi LLP

(57) ABSTRACT

A method of calculating net sensible cooling capacity of a cooling unit includes measuring a discharge pressure from of fluid from a compressor and a suction pressure from an evaporator, calculating a condensing temperature of fluid flowing from the compressor and an evaporating temperature of fluid flowing from the evaporator, calculating a mass flow rate of fluid flowing from the compressor, calculating enthalpy of fluid flowing from the compressor, of fluid flowing from the thermal expansion valve, and of fluid flowing from the evaporator, calculating a mass flow rate of fluid flowing through the hot gas bypass valve, and calculating net sensible cooling capacity. Embodiments of cooling units and other methods are further disclosed.

15 Claims, 17 Drawing Sheets

(51) Int. Cl.
*F25D 21/00* (2006.01)
*F25B 47/00* (2006.01)
*F25B 1/00* (2006.01)
*F24F 11/00* (2006.01)
*F25B 49/02* (2006.01)

(52) U.S. Cl.
CPC . *F24F 2011/0091* (2013.01); *F25B 2400/0403* (2013.01); *F25B 2500/18* (2013.01); *F25B 2500/19* (2013.01); *F25B 2600/111* (2013.01); *F25B 2600/112* (2013.01); *F25B 2600/2501* (2013.01); *F25B 2700/13* (2013.01); *F25B 2700/1931* (2013.01); *F25B 2700/1933* (2013.01); *Y02B 30/743* (2013.01)

(56) References Cited

U.S. PATENT DOCUMENTS

| | | |
|---|---|---|
| 2,455,022 A | 11/1948 | Schmidt |
| 3,317,798 A | 5/1967 | Chu et al. |
| 3,559,728 A | 2/1971 | Lyman et al. |
| 3,643,007 A | 2/1972 | Roberts et al. |
| 3,665,725 A | 5/1972 | Barlass et al. |
| 3,681,936 A | 8/1972 | Park |
| 3,742,725 A | 7/1973 | Berger |
| 3,995,446 A | 12/1976 | Eubank |
| 4,055,053 A | 10/1977 | Elfving et al. |
| 4,127,008 A | 11/1978 | Tyree, Jr. |
| 4,197,716 A | 4/1980 | Nussbaum |
| 4,223,535 A | 9/1980 | Kumm |
| 4,275,570 A | 6/1981 | Szymaszek et al. |
| 4,285,205 A | 8/1981 | Martin et al. |
| 4,338,794 A | 7/1982 | Haasis, Jr. |
| 4,419,865 A | 12/1983 | Szymaszek |
| 4,515,746 A | 5/1985 | Brun et al. |
| 4,590,538 A | 5/1986 | Cray, Jr. |
| 4,599,873 A | 7/1986 | Hyde |
| 4,696,168 A | 9/1987 | Woods et al. |
| 4,718,249 A | 1/1988 | Hanson |
| 4,747,041 A | 5/1988 | Engel et al. |
| 4,774,631 A | 9/1988 | Okuyama et al. |
| 4,823,247 A | 4/1989 | Tamoto |
| 4,823,290 A | 4/1989 | Fasack et al. |
| 4,827,151 A | 5/1989 | Okado |
| 4,827,733 A | 5/1989 | Dinh |
| 4,831,508 A | 5/1989 | Hunter |
| 4,837,663 A | 6/1989 | Zushi et al. |
| 4,911,231 A | 3/1990 | Horne et al. |
| 4,937,505 A | 6/1990 | Deglon et al. |
| 4,944,158 A | 7/1990 | Akiike et al. |
| 4,962,734 A | 10/1990 | Jorgensen |
| 4,980,812 A | 12/1990 | Johnson, Jr. et al. |
| 5,017,800 A | 5/1991 | Divan |
| 5,019,717 A | 5/1991 | McCurry et al. |
| 5,057,968 A | 10/1991 | Morrison |
| 5,095,712 A | 3/1992 | Narreau |
| 5,097,328 A | 3/1992 | Boyette |
| 5,126,585 A | 6/1992 | Boys |
| 5,150,580 A | 9/1992 | Hyde |
| 5,153,837 A | 10/1992 | Shaffer et al. |
| 5,158,132 A | 10/1992 | Guillemot |
| 5,168,724 A | 12/1992 | Gilbertson et al. |
| 5,173,819 A | 12/1992 | Takahashi et al. |
| 5,177,666 A | 1/1993 | Bland et al. |
| 5,181,653 A | 1/1993 | Foster et al. |
| 5,195,706 A | 3/1993 | Allen |
| 5,216,623 A | 6/1993 | Barrett et al. |
| 5,234,185 A | 8/1993 | Hoffman et al. |
| 5,269,372 A | 12/1993 | Chu et al. |
| 5,367,670 A | 11/1994 | Ward et al. |
| 5,381,554 A | 1/1995 | Langer et al. |
| 5,382,943 A | 1/1995 | Tanaka |
| 5,388,422 A | 2/1995 | Hayashida et al. |
| 5,404,136 A | 4/1995 | Marsden |
| 5,462,225 A | 10/1995 | Massara et al. |
| 5,507,529 A | 4/1996 | Martins |
| 5,519,306 A | 5/1996 | Itoh et al. |
| 5,528,507 A | 6/1996 | McNamara et al. |
| 5,533,357 A | 7/1996 | Voorhis |
| 5,572,873 A | 11/1996 | Lavigne et al. |
| 5,581,478 A | 12/1996 | Cruse et al. |
| 5,582,020 A | 12/1996 | Scaringe et al. |
| 5,649,428 A | 7/1997 | Calton et al. |
| 5,654,591 A | 8/1997 | Mabboux et al. |
| 5,657,641 A | 8/1997 | Cunningham et al. |
| 5,682,949 A | 11/1997 | Ratcliffe et al. |
| 5,684,686 A | 11/1997 | Reddy |
| 5,694,780 A | 12/1997 | Alsenz |
| 5,704,219 A | 1/1998 | Suzuki et al. |
| 5,718,628 A | 2/1998 | Nakazato et al. |
| 5,735,134 A | 4/1998 | Liu et al. |
| 5,749,237 A | 5/1998 | Sandofsky et al. |
| 5,794,897 A | 8/1998 | Jobin et al. |
| 5,802,856 A | 9/1998 | Schaper et al. |
| 5,845,090 A | 12/1998 | Collins, III et al. |
| 5,850,539 A | 12/1998 | Cook et al. |
| 5,860,012 A | 1/1999 | Luu |
| 5,860,280 A | 1/1999 | Recine, Sr. et al. |
| 5,896,922 A | 4/1999 | Chrysler et al. |
| 5,949,974 A | 9/1999 | Ewing et al. |
| 5,953,930 A | 9/1999 | Chu et al. |
| 5,954,127 A | 9/1999 | Chrysler et al. |
| 5,959,240 A | 9/1999 | Yoshida et al. |
| 5,960,204 A | 9/1999 | Yinger et al. |
| 5,963,425 A | 10/1999 | Chrysler et al. |
| 5,963,457 A | 10/1999 | Kanoi et al. |
| 5,970,731 A | 10/1999 | Hare et al. |
| 5,970,734 A | 10/1999 | Stillwell et al. |
| 5,972,196 A | 10/1999 | Murphy et al. |
| 5,974,237 A | 10/1999 | Shurmer et al. |
| 5,978,594 A | 11/1999 | Bonnell et al. |
| 5,978,912 A | 11/1999 | Rakavy et al. |
| 5,982,652 A | 11/1999 | Simonelli et al. |
| 5,984,144 A | 11/1999 | Wyatt |
| 5,987,614 A | 11/1999 | Mitchell et al. |
| 5,995,729 A | 11/1999 | Hirosawa et al. |
| 6,023,935 A | 2/2000 | Okazaki et al. |
| 6,032,472 A | 3/2000 | Heinrichs et al. |
| 6,034,872 A | 3/2000 | Chrysler et al. |
| 6,038,879 A | 3/2000 | Turcotte et al. |
| 6,055,480 A | 4/2000 | Nevo et al. |
| 6,085,243 A | 7/2000 | Fletcher et al. |
| 6,088,225 A | 7/2000 | Parry et al. |
| 6,104,868 A | 8/2000 | Peters et al. |
| 6,105,061 A | 8/2000 | Nakai |
| 6,108,782 A | 8/2000 | Fletcher et al. |
| 6,111,036 A | 8/2000 | Wonders et al. |
| 6,112,235 A | 8/2000 | Spofford |
| 6,134,511 A | 10/2000 | Subbarao |
| 6,141,762 A | 10/2000 | Nicol et al. |
| 6,189,109 B1 | 2/2001 | Sheikh et al. |
| 6,199,204 B1 | 3/2001 | Donohue |
| 6,208,510 B1 | 3/2001 | Trudeau et al. |
| 6,209,330 B1 | 4/2001 | Timmerman et al. |
| 6,213,194 B1 | 4/2001 | Chrysler et al. |
| 6,216,482 B1 | 4/2001 | Xiao et al. |
| 6,216,956 B1 | 4/2001 | Ehlers et al. |
| 6,223,810 B1 | 5/2001 | Chu et al. |
| 6,237,353 B1 | 5/2001 | Sishtla et al. |
| 6,246,969 B1 | 6/2001 | Sinclair et al. |
| 6,266,721 B1 | 7/2001 | Sheikh et al. |
| 6,276,161 B1 | 8/2001 | Peiffer et al. |
| 6,281,790 B1 | 8/2001 | Kimmel et al. |
| 6,305,180 B1 | 10/2001 | Miller et al. |
| 6,327,143 B1 | 12/2001 | Bonstrom et al. |
| 6,332,202 B1 | 12/2001 | Sheikh et al. |
| 6,332,335 B1 | 12/2001 | Kajimoto et al. |
| 6,347,627 B1 | 2/2002 | Frankie et al. |
| 6,363,421 B2 | 3/2002 | Barker et al. |
| 6,374,627 B1 | 4/2002 | Schumacher et al. |
| 6,381,700 B1 | 4/2002 | Yoshida |
| 6,389,464 B1 | 5/2002 | Krishnamurthy et al. |
| 6,415,628 B1 | 7/2002 | Ahmed et al. |
| 6,438,978 B1 | 8/2002 | Bessler |

(56) References Cited

U.S. PATENT DOCUMENTS

| | | |
|---|---|---|
| 6,457,076 B1 | 9/2002 | Cheng et al. |
| 6,459,579 B1 | 10/2002 | Farmer et al. |
| 6,474,087 B1 | 11/2002 | Lifson |
| 6,483,730 B2 | 11/2002 | Johnson, Jr. |
| 6,494,050 B2 | 12/2002 | Spinazzola et al. |
| 6,557,624 B1 | 5/2003 | Stahl et al. |
| 6,574,104 B2 | 6/2003 | Patel et al. |
| 6,575,234 B2 | 6/2003 | Nelson |
| 6,640,889 B1 | 11/2003 | Harte et al. |
| 6,661,678 B2 | 12/2003 | Raddi et al. |
| 6,662,576 B1 | 12/2003 | Bai |
| 6,668,565 B1 | 12/2003 | Johnson et al. |
| 6,672,955 B2 | 1/2004 | Charron |
| 6,682,100 B2 | 1/2004 | Wood et al. |
| 6,694,759 B1 | 2/2004 | Bash et al. |
| 6,695,577 B1 | 2/2004 | Susek |
| 6,714,977 B1 | 3/2004 | Fowler et al. |
| 6,718,277 B2 | 4/2004 | Sharma |
| 6,718,781 B2 | 4/2004 | Freund et al. |
| 6,721,672 B2 | 4/2004 | Spitaels et al. |
| 6,745,579 B2 | 6/2004 | Spinazzola et al. |
| 6,745,590 B1 | 6/2004 | Johnson et al. |
| 6,761,212 B2 | 7/2004 | DiPaolo |
| 6,775,137 B2 | 8/2004 | Chu et al. |
| 6,795,928 B2 | 9/2004 | Bradley et al. |
| 6,804,616 B2 | 10/2004 | Bodas |
| 6,804,975 B2 | 10/2004 | Park |
| 6,814,134 B1 | 11/2004 | Pravda |
| 6,819,563 B1 | 11/2004 | Chu et al. |
| 6,827,142 B2 | 12/2004 | Winkler et al. |
| 6,829,630 B1 | 12/2004 | Pajak et al. |
| 6,832,504 B1 | 12/2004 | Birkmann |
| 6,848,989 B2 | 2/2005 | Miyazaki et al. |
| 6,859,366 B2 | 2/2005 | Fink |
| 6,859,882 B2 | 2/2005 | Fung |
| 6,862,179 B2 | 3/2005 | Beitelmal et al. |
| 6,880,349 B2 | 4/2005 | Johnson et al. |
| 6,881,142 B1 | 4/2005 | Nair |
| 6,886,353 B2 | 5/2005 | Patel et al. |
| 6,889,908 B2 | 5/2005 | Crippen et al. |
| 6,901,767 B2 | 6/2005 | Wood |
| 6,924,981 B2 | 8/2005 | Chu et al. |
| 6,927,980 B2 | 8/2005 | Fukuda et al. |
| 6,944,035 B2 | 9/2005 | Raddi et al. |
| 6,955,058 B2 | 10/2005 | Taras et al. |
| 6,959,558 B2 | 11/2005 | Bean, Jr. et al. |
| 6,964,539 B2 | 11/2005 | Bradley et al. |
| 6,967,283 B2 | 11/2005 | Rasmussen et al. |
| 6,967,841 B1 | 11/2005 | Chu et al. |
| 6,973,797 B2 | 12/2005 | Nemit, Jr. |
| 6,973,801 B1 | 12/2005 | Campbell et al. |
| 6,980,433 B2 | 12/2005 | Fink |
| 7,000,416 B2 | 2/2006 | Hirooka et al. |
| 7,000,467 B2 | 2/2006 | Chu et al. |
| 7,012,807 B2 | 3/2006 | Chu et al. |
| 7,012,825 B2 | 3/2006 | Nielsen |
| 7,020,586 B2 | 3/2006 | Snevely |
| 7,031,870 B2 | 4/2006 | Sharma et al. |
| 7,032,119 B2 | 4/2006 | Fung |
| 7,033,267 B2 | 4/2006 | Rasmussen |
| 7,046,514 B2 | 5/2006 | Fink et al. |
| 7,047,300 B1 | 5/2006 | Oehrke et al. |
| 7,051,802 B2 | 5/2006 | Baer |
| 7,051,946 B2 | 5/2006 | Bash et al. |
| 7,065,600 B2 | 6/2006 | Papa et al. |
| 7,082,541 B2 | 7/2006 | Hammond et al. |
| 7,085,133 B2 | 8/2006 | Hall |
| 7,086,247 B2 | 8/2006 | Campbell et al. |
| 7,091,625 B2 | 8/2006 | Okusawa et al. |
| 7,104,081 B2 | 9/2006 | Chu et al. |
| 7,106,590 B2 | 9/2006 | Chu et al. |
| 7,112,131 B2 | 9/2006 | Rasmussen et al. |
| 7,120,021 B2 | 10/2006 | Hamman |
| 7,120,689 B2 | 10/2006 | Gonsalves et al. |
| 7,140,193 B2 | 11/2006 | Johnson et al. |
| 7,145,772 B2 | 12/2006 | Fink |
| 7,146,353 B2 | 12/2006 | Garg et al. |
| 7,148,796 B2 | 12/2006 | Joy et al. |
| 7,155,318 B2 | 12/2006 | Sharma et al. |
| 7,165,412 B1 | 1/2007 | Bean, Jr. |
| 7,173,820 B2 | 2/2007 | Fink et al. |
| 7,184,269 B2 | 2/2007 | Campbell et al. |
| 7,187,549 B2 | 3/2007 | Teneketges et al. |
| 7,197,433 B2 | 3/2007 | Patel et al. |
| 7,228,707 B2 | 6/2007 | Lifson et al. |
| 7,236,363 B2 | 6/2007 | Belady |
| 7,251,547 B2 | 7/2007 | Bash et al. |
| 7,254,307 B2 | 8/2007 | Xin |
| 7,259,963 B2 | 8/2007 | Germagian et al. |
| 7,270,174 B2 | 9/2007 | Chu et al. |
| 7,272,005 B2 | 9/2007 | Campbell et al. |
| 7,274,566 B2 | 9/2007 | Campbell et al. |
| 7,278,273 B1 | 10/2007 | Whitted et al. |
| 7,284,379 B2 | 10/2007 | Pham et al. |
| 7,292,898 B2 | 11/2007 | Clark et al. |
| 7,293,666 B2 | 11/2007 | Mattlin et al. |
| 7,298,617 B2 | 11/2007 | Campbell et al. |
| 7,298,618 B2 | 11/2007 | Campbell et al. |
| 7,313,503 B2 | 12/2007 | Nakagawa et al. |
| 7,315,448 B1 | 1/2008 | Bash et al. |
| 7,319,594 B2 | 1/2008 | Nicolai et al. |
| 7,365,973 B2 | 4/2008 | Rasmussen et al. |
| 7,366,632 B2 | 4/2008 | Hamann et al. |
| 7,403,391 B2 | 7/2008 | Germagian et al. |
| 7,406,839 B2 | 8/2008 | Bean et al. |
| 7,418,825 B1 | 9/2008 | Bean, Jr. |
| 7,426,453 B2 | 9/2008 | Patel et al. |
| 7,462,453 B2 | 12/2008 | Yamada et al. |
| 7,472,043 B1 | 12/2008 | Low et al. |
| 7,558,649 B1 | 7/2009 | Sharma et al. |
| 7,568,360 B1 | 8/2009 | Bash et al. |
| 7,596,476 B2 | 9/2009 | Rasmussen et al. |
| 7,620,480 B2 | 11/2009 | Patel et al. |
| 7,676,280 B1 | 3/2010 | Bash et al. |
| 7,681,404 B2 | 3/2010 | Bean, Jr. |
| 7,705,489 B2 | 4/2010 | Nielsen et al. |
| 7,726,144 B2 | 6/2010 | Larson et al. |
| 7,775,055 B2 | 8/2010 | Bean et al. |
| 7,881,910 B2 | 2/2011 | Rasmussen et al. |
| 7,885,795 B2 | 2/2011 | Rasmussen et al. |
| 7,979,250 B2 | 7/2011 | Archibald et al. |
| 8,322,155 B2 | 12/2012 | Tutunoglu et al. |
| 8,327,656 B2 | 12/2012 | Tutunoglu et al. |
| 2001/0005894 A1 | 6/2001 | Fukui |
| 2001/0042616 A1 | 11/2001 | Baer |
| 2001/0047213 A1 | 11/2001 | Sepe |
| 2001/0047387 A1 | 11/2001 | Brockhurst |
| 2001/0047410 A1 | 11/2001 | Defosse |
| 2001/0052006 A1 | 12/2001 | Barker et al. |
| 2001/0055965 A1 | 12/2001 | Delp et al. |
| 2002/0004912 A1 | 1/2002 | Fung |
| 2002/0023258 A1 | 2/2002 | Elwahab et al. |
| 2002/0043969 A1 | 4/2002 | Duncan et al. |
| 2002/0055909 A1 | 5/2002 | Fung et al. |
| 2002/0059804 A1 | 5/2002 | Spinazzola et al. |
| 2002/0062454 A1 | 5/2002 | Fung |
| 2002/0071031 A1 | 6/2002 | Lord et al. |
| 2002/0072868 A1 | 6/2002 | Bartone et al. |
| 2002/0112054 A1 | 8/2002 | Hatanaka |
| 2002/0124081 A1 | 9/2002 | Primm et al. |
| 2002/0129355 A1 | 9/2002 | Velten et al. |
| 2002/0130648 A1 | 9/2002 | Raddi et al. |
| 2002/0134096 A1 | 9/2002 | Shim et al. |
| 2002/0134567 A1 | 9/2002 | Rasmussen et al. |
| 2002/0149911 A1 | 10/2002 | Bishop et al. |
| 2002/0161885 A1 | 10/2002 | Childers et al. |
| 2003/0003350 A1 | 1/2003 | Heimer et al. |
| 2003/0019221 A1 | 1/2003 | Rossi et al. |
| 2003/0033550 A1 | 2/2003 | Kuiawa et al. |
| 2003/0042004 A1 | 3/2003 | Novotny et al. |
| 2003/0084357 A1 | 5/2003 | Bresniker et al. |
| 2003/0084358 A1 | 5/2003 | Bresniker et al. |
| 2003/0084359 A1 | 5/2003 | Bresniker et al. |
| 2003/0115000 A1 | 6/2003 | Bodas |

(56) References Cited

U.S. PATENT DOCUMENTS

| | | |
|---|---|---|
| 2003/0115024 A1 | 6/2003 | Snevely |
| 2003/0120780 A1 | 6/2003 | Zhu et al. |
| 2003/0121689 A1 | 7/2003 | Rasmussen et al. |
| 2003/0147214 A1 | 8/2003 | Patel et al. |
| 2003/0147216 A1 | 8/2003 | Patel et al. |
| 2003/0154285 A1 | 8/2003 | Berglund et al. |
| 2003/0158718 A1 | 8/2003 | Nakagawa et al. |
| 2003/0184975 A1 | 10/2003 | Steinman et al. |
| 2003/0188208 A1 | 10/2003 | Fung |
| 2003/0193777 A1 | 10/2003 | Friedrich et al. |
| 2003/0196126 A1 | 10/2003 | Fung |
| 2003/0200130 A1 | 10/2003 | Kall et al. |
| 2003/0200295 A1 | 10/2003 | Roberts et al. |
| 2003/0200473 A1 | 10/2003 | Fung |
| 2003/0204756 A1 | 10/2003 | Ransom et al. |
| 2003/0236822 A1 | 12/2003 | Graupner et al. |
| 2004/0003266 A1 | 1/2004 | Moshir et al. |
| 2004/0010569 A1 | 1/2004 | Thomas et al. |
| 2004/0016243 A1 | 1/2004 | Song et al. |
| 2004/0020224 A1 | 2/2004 | Bash et al. |
| 2004/0031280 A1 | 2/2004 | Martin et al. |
| 2004/0031282 A1 | 2/2004 | Kopko |
| 2004/0061030 A1 | 4/2004 | Goodwin et al. |
| 2004/0065097 A1 | 4/2004 | Bash et al. |
| 2004/0065100 A1 | 4/2004 | Jacobsen |
| 2004/0065104 A1 | 4/2004 | Bash et al. |
| 2004/0073597 A1 | 4/2004 | Caveney et al. |
| 2004/0075343 A1 | 4/2004 | Wareham et al. |
| 2004/0075984 A1 | 4/2004 | Bash et al. |
| 2004/0078708 A1 | 4/2004 | Li et al. |
| 2004/0083012 A1 | 4/2004 | Miller |
| 2004/0084967 A1 | 5/2004 | Nielsen |
| 2004/0089009 A1 | 5/2004 | Bash et al. |
| 2004/0089011 A1 | 5/2004 | Patel et al. |
| 2004/0098991 A1 | 5/2004 | Heyes |
| 2004/0099747 A1 | 5/2004 | Johnson et al. |
| 2004/0100770 A1 | 5/2004 | Chu et al. |
| 2004/0120855 A1 | 6/2004 | Reichel et al. |
| 2004/0155526 A1 | 8/2004 | Naden et al. |
| 2004/0163001 A1 | 8/2004 | Bodas |
| 2004/0184232 A1 | 9/2004 | Fink |
| 2004/0186905 A1 | 9/2004 | Young et al. |
| 2004/0189161 A1 | 9/2004 | Davis et al. |
| 2004/0190247 A1 | 9/2004 | Chu et al. |
| 2004/0223300 A1 | 11/2004 | Fink et al. |
| 2004/0230848 A1 | 11/2004 | Mayo et al. |
| 2004/0240514 A1 | 12/2004 | Bash et al. |
| 2004/0262409 A1 | 12/2004 | Crippen et al. |
| 2005/0016189 A1 | 1/2005 | Wacker |
| 2005/0023363 A1 | 2/2005 | Sharma et al. |
| 2005/0044882 A1 | 3/2005 | Hong et al. |
| 2005/0055590 A1 | 3/2005 | Farkas et al. |
| 2005/0061013 A1 | 3/2005 | Bond |
| 2005/0071699 A1 | 3/2005 | Hammond et al. |
| 2005/0108582 A1 | 5/2005 | Fung |
| 2005/0111669 A1 | 5/2005 | Park et al. |
| 2005/0114507 A1 | 5/2005 | Tarui et al. |
| 2005/0132729 A1 | 6/2005 | Manole |
| 2005/0170770 A1 | 8/2005 | Johnson et al. |
| 2005/0177755 A1 | 8/2005 | Fung |
| 2005/0182523 A1 | 8/2005 | Nair |
| 2005/0185654 A1 | 8/2005 | Zadikian et al. |
| 2005/0198247 A1 | 9/2005 | Perry et al. |
| 2005/0207909 A1 | 9/2005 | Bean et al. |
| 2005/0210905 A1 | 9/2005 | Burns et al. |
| 2005/0213306 A1 | 9/2005 | Vos et al. |
| 2005/0225936 A1 | 10/2005 | Day |
| 2005/0228618 A1 | 10/2005 | Patel et al. |
| 2005/0235671 A1 | 10/2005 | Belady et al. |
| 2005/0237715 A1 | 10/2005 | Staben et al. |
| 2005/0237716 A1 | 10/2005 | Chu et al. |
| 2005/0246431 A1 | 11/2005 | Spitaels |
| 2005/0247829 A1 | 11/2005 | Low et al. |
| 2005/0248922 A1 | 11/2005 | Chu et al. |
| 2005/0251802 A1 | 11/2005 | Bozek et al. |
| 2005/0267639 A1 | 12/2005 | Sharma et al. |
| 2005/0284169 A1 | 12/2005 | Tamura et al. |
| 2006/0002086 A1 | 1/2006 | Teneketges et al. |
| 2006/0015712 A1 | 1/2006 | Ang et al. |
| 2006/0025010 A1 | 2/2006 | Spitaels et al. |
| 2006/0042289 A1 | 3/2006 | Campbell et al. |
| 2006/0072262 A1 | 4/2006 | Paik et al. |
| 2006/0080001 A1 | 4/2006 | Bash et al. |
| 2006/0081545 A1 | 4/2006 | Rassmussen et al. |
| 2006/0082263 A1 | 4/2006 | Rimler et al. |
| 2006/0096306 A1 | 5/2006 | Okaza et al. |
| 2006/0102575 A1 | 5/2006 | Mattlin et al. |
| 2006/0108481 A1 | 5/2006 | Riedy et al. |
| 2006/0112286 A1 | 5/2006 | Whalley et al. |
| 2006/0115586 A1 | 6/2006 | Xing et al. |
| 2006/0121421 A1 | 6/2006 | Spitaels et al. |
| 2006/0126296 A1 | 6/2006 | Campbell et al. |
| 2006/0139877 A1 | 6/2006 | Germagian et al. |
| 2006/0144073 A1 | 7/2006 | Lee et al. |
| 2006/0162357 A1 | 7/2006 | Fink et al. |
| 2006/0168975 A1 | 8/2006 | Malone et al. |
| 2006/0203834 A1 | 9/2006 | Augustinus |
| 2006/0214014 A1 | 9/2006 | Bash et al. |
| 2006/0232945 A1 | 10/2006 | Chu et al. |
| 2006/0238941 A1 | 10/2006 | Ingemi et al. |
| 2006/0242288 A1 | 10/2006 | Masurkar |
| 2006/0250770 A1 | 11/2006 | Campbell et al. |
| 2006/0260338 A1 | 11/2006 | VanGilder et al. |
| 2006/0276121 A1 | 12/2006 | Rasmussen |
| 2007/0025271 A1 | 2/2007 | Niedrich et al. |
| 2007/0038414 A1 | 2/2007 | Rasmussen et al. |
| 2007/0072536 A1 | 3/2007 | Johnson et al. |
| 2007/0074537 A1 | 4/2007 | Bean et al. |
| 2007/0076373 A1 | 4/2007 | Fink |
| 2007/0078635 A1 | 4/2007 | Rasmussen et al. |
| 2007/0081302 A1 | 4/2007 | Nicolai et al. |
| 2007/0085678 A1 | 4/2007 | Joy et al. |
| 2007/0088822 A1 | 4/2007 | Coile et al. |
| 2007/0091569 A1 | 4/2007 | Campbell et al. |
| 2007/0091570 A1 | 4/2007 | Campbell et al. |
| 2007/0121295 A1 | 5/2007 | Campbell et al. |
| 2007/0129000 A1 | 6/2007 | Rasmussen et al. |
| 2007/0146994 A1 | 6/2007 | Germagian et al. |
| 2007/0150215 A1 | 6/2007 | Spitaels et al. |
| 2007/0150584 A1 | 6/2007 | Srinivasan |
| 2007/0163748 A1 | 7/2007 | Rasmussen et al. |
| 2007/0165377 A1 | 7/2007 | Rasmussen et al. |
| 2007/0167125 A1 | 7/2007 | Rasmussen et al. |
| 2007/0171613 A1 | 7/2007 | McMahan et al. |
| 2007/0174024 A1 | 7/2007 | Rasmussen et al. |
| 2007/0187343 A1 | 8/2007 | Colucci et al. |
| 2007/0190919 A1 | 8/2007 | Donovan et al. |
| 2007/0213000 A1 | 9/2007 | Day |
| 2007/0271475 A1 | 11/2007 | Hatasaki et al. |
| 2007/0274035 A1 | 11/2007 | Fink et al. |
| 2008/0002364 A1 | 1/2008 | Campbell et al. |
| 2008/0004837 A1 | 1/2008 | Zwinger et al. |
| 2008/0037217 A1 | 2/2008 | Murakami et al. |
| 2008/0041076 A1 | 2/2008 | Tutunoglu et al. |
| 2008/0041077 A1 | 2/2008 | Tutunoglu |
| 2008/0055852 A1 | 3/2008 | Uluc et al. |
| 2008/0104985 A1 | 5/2008 | Carlsen |
| 2008/0105412 A1 | 5/2008 | Carlsen et al. |
| 2008/0105753 A1 | 5/2008 | Carlsen et al. |
| 2008/0141703 A1 | 6/2008 | Bean, Jr. |
| 2008/0142068 A1 | 6/2008 | Bean et al. |
| 2008/0174954 A1 | 7/2008 | VanGilder et al. |
| 2008/0177424 A1 | 7/2008 | Wheeler |
| 2008/0180908 A1 | 7/2008 | Wexler |
| 2008/0198549 A1 | 8/2008 | Rasmussen et al. |
| 2008/0229318 A1 | 9/2008 | Franke |
| 2008/0245083 A1 | 10/2008 | Tutunoglu et al. |
| 2009/0007591 A1 | 1/2009 | Bean et al. |
| 2009/0019875 A1 | 1/2009 | Fink et al. |
| 2009/0030554 A1 | 1/2009 | Bean, Jr. et al. |
| 2009/0121547 A1 | 5/2009 | Paik et al. |
| 2009/0138313 A1 | 5/2009 | Morgan et al. |
| 2009/0138888 A1 | 5/2009 | Shah et al. |
| 2009/0150123 A1 | 6/2009 | Archibald et al. |

(56) References Cited

U.S. PATENT DOCUMENTS

| | | |
|---|---|---|
| 2009/0223234 A1 | 9/2009 | Campbell et al. |
| 2009/0259343 A1 | 10/2009 | Rasmussen et al. |
| 2009/0276771 A1 | 11/2009 | Nickolov et al. |
| 2010/0057263 A1 | 3/2010 | Tutunoglu |
| 2010/0170663 A1 | 7/2010 | Bean, Jr. |
| 2010/0211669 A1 | 8/2010 | Dalgas et al. |
| 2010/0211810 A1 | 8/2010 | Zacho |
| 2010/0286956 A1 | 11/2010 | VanGilder et al. |

FOREIGN PATENT DOCUMENTS

| | | |
|---|---|---|
| DE | 102006041788 A1 | 3/2008 |
| EP | 0602911 A1 | 6/1994 |
| EP | 1610077 A2 | 12/2005 |
| EP | 1672300 A1 | 6/2006 |
| FR | 2624684 A1 | 6/1989 |
| FR | 2864854 A1 | 7/2005 |
| JP | 63-127042 A | 5/1988 |
| JP | 07-044275 A | 2/1995 |
| JP | 07269926 A | 10/1995 |
| JP | 09-298377 A | 11/1997 |
| JP | 2001-260640 A | 9/2001 |
| JP | 2002-101973 A | 4/2002 |
| JP | 2002-119339 A | 4/2002 |
| WO | 00/58673 A1 | 10/2000 |
| WO | 02/065030 A1 | 8/2002 |
| WO | 03005200 A1 | 1/2003 |
| WO | 03/083631 A1 | 10/2003 |
| WO | 03081406 A1 | 10/2003 |
| WO | 2005081091 A2 | 9/2005 |
| WO | 2005/122664 A1 | 12/2005 |
| WO | 2006/034718 A1 | 4/2006 |
| WO | 2006119248 A2 | 11/2006 |
| WO | 2006124240 A2 | 11/2006 |
| WO | 2007095144 A2 | 8/2007 |
| WO | 2008144375 A2 | 11/2008 |
| WO | 2009/014893 A1 | 1/2009 |

OTHER PUBLICATIONS

"Essential Cooling System Requirements for Next Generation Data Centers," White Paper #5, Revision 3, 2003 American Power Conversion, Rev 2002-3, pp. 1-10.

"How and Why Mission-Critical Cooling Systems Differ From Common Air Conditions," White Paper #56, Revision 2, 2003 American Power Conversion, Rev 2003-2, pp. 1-13.

"Management Strategy for Network Critical Physical Infrastructure", White Paper #100, pp. 110, American Power Conversion, Dec. 15, 2003, published on World Wide Web.

Abdlmonem H. Beitelmal et al.: "Thermo-Fluids Provisioning of a High Performance High Density Data Center" Distributed and Parallel Databases, Kluwer Academic Publishers, BO, vol. 21, No. 2-3, Apr. 22, 2006, pp. 227-238, XP019499843, ISSN: 1573-7578.

Abi-Zadeh, Davar et al., "A Transient Analysis of Environmental Conditions for a Mission Critical Facility after a Failure of Power", Arup Mission Criticial Facilities, Feb. 2001, pp. 1-12.

Ahmad, Jasim U. et al., "Navier-Stokes simulation of air-conditioning facility of a large modern computer room," Jun. 2005, Proceedings of the 2005 ASME Fluids Engineering Division Summer Meeting and Exhibition, pp. 1-6.

Althouse, Turnquist, Bracciano: "Modern Refrigeration and Air Conditioning," 2000, The Goodheart-Willcox Company, Inc., XP002479591, pp. 715-716.

APC User's Guide Brochure, "InfraStruXure Manager," Mar. 2004, 181 pgs.

Ashrae, "Thermal Guidelines for Data Processing Environments" 2004, Atlanta: American Society of Heating, Refrigerating, and Air-Conditioning Engineers, Inc., 2004, Atlanta.

Bash, C. E. et al.: "Balance of Power: Dynamic Thermal Management for Internet Data Centers", IEEE Internet Computing , Jan. 1, 2005, pp. 42-49, vol. 9, No. 1, IEEE Service Center, New York, NY.

Bash, C.E., Patel, C.D., and Sharma, R.K., "Efficient Thermal Management of Data Centers—Immediate and Long-Term Research Needs" Intl. J. Heat, Ventilating, Air-Conditioning and Refrigeration Research, 2003, pp. 137-152, vol. 9, No. 2.

Beitelmal et al., "Thermo-Fluids Provisioning of a High Performance High Density Data Center", Apr. 22, 2006, Springer Science and Business Media, Inc, Distributed and Parallel Databases, 21, pp. 227-238 D0I:1 0.1 007/s1 0619-005-0413-0.

Chandrakant D. Patel, et al., "Thermal Considerations in Cooling Large Scale High Copute Density Data Centers" IEEE 2002, pp. 767-776.

Dvinsky: "Hot Tips for Using Cooling Software a Little Planning Lets Users Get More from Their Thermal-Simulation Software", Machine Design, Penton Media, Cleveland, OH, vol. 72, No. 4, Feb. 24, 2000.

Ehsan Pakabaznia et al., "Miminizing data center cooling and server power costs", Proceedings of the 14th ACM/IEEE International Symposium on Low Power Electronics and Design, ISLPED '09, Jan. 1, 2009, p. 145, XP55015368, New York, New York, USA, DOI: 10.1145/1594233.1594268, ISBN: 978-1-60-558684-7.

Herrlin, M.K., "Rack Cooling Effectiveness in Data Centers and Telecom Central Offices: The Rack Cooling Index (RCI)," ASHRAE Transaction, 2005, pp. 725-731, vol. 111(2).

Innovative Research, Inc., http://web.archive.org/web/20051221005029/http://www.inres.com/, Dec. 21, 2005, published on World Wide Web.

International Search Report and Written Opinion from corresponding International Application No. PCT/2010/022074, dated Jul. 27, 2010.

International Search Report and Written Opinion from corresponding International Application No. PCT/US2011/052561, dated Dec. 27, 2011.

International Search Report for PCT/US07/01109 mailed Mar. 28, 2008.

International Search Report for PCT/US2006/037772 mailed Jul. 10, 2007.

International Search Report for PCT/US2006/16739 mailed Oct. 3, 2006.

International Search Report for PCT/US2007/087910 mailed Apr. 15, 2009.

International Search Report for PCT/US2007/087928 mailed Jul. 29, 2008.

International Search Report for PCT/US2008/051908 mailed Jul. 3, 2008.

International Search Report for PCT/US2009/043400 mailed Nov. 23, 2009.

International Search Report for PCT/US2009/065700 mailed Feb. 18, 2010.

International Search Report for PCT/US2010/023142, mailed May 11, 2010.

International Search Report for PCT/US2010/033867 mailed Jul. 7, 2010.

International Search Report for PCT/US2010/033876 mailed Jul. 1, 2010.

International Search Report for PCT/US2010/035089 mailed Jul. 26, 2010.

International Search Report for PCT/US2011/051866 mailed Feb. 24, 2012.

International Search Report for PCT/US2011/067332 mailed Jun. 8, 2012.

Jeffrey Rambo et al., "Modeling of data center airflow and heat transfer: State of the art and future trends", Distributed and Parallel Databases, Kluwer Academic Publishers, BO, vol. 21, No. 2-3, Jan. 20, 2007, pp. 193-225, XP019499845, ISSN: 1573-7578, D0I:10. 1007/S10619-006-7007-3.

K. Dunlap, "Cooling Audit for Identifying Potential Cooling Problems in Data Centers", White Paper #40, pp. 1-18, American Power Conversion, May 20, 2004, published on World Wide Web.

Le et al., "Operating Behaviour of Single Split Coil Systems Under Modulating and Two-Position Control" Published 2005 by American Society of Heating, Refrigerating and Air-Conditioning Engineers, Inc.

(56) References Cited

OTHER PUBLICATIONS

Modern Refrigeration and Air Conditioning (18th Edition) Althouse et al. Published by The Goodheart-Willcox Company, Inc. (c)2000.

N. Rasmussen, "Calculating Total Cooling Requirements for Data Centers", White Paper #25, pp. 1-8, American Power Conversion, May 20, 2004, published on World Wide Web.

N. Rasmussen, "Cooling Strategies for Ultra-High Density Racks and Blade Servers", White Paper #46, pp. 1-22, American Power Conversion, Mar. 29, 2005, published on World Wide Web.

N. Rasmussen, "Strategies for Deploying Blade Servers in Existing Data Centers", White Paper #125, pp. 1-14, American Power Conversion, Mar. 29, 2005, published on World Wide Web.

Neil Rasmussen, "Air Distribution Architecture Options for Mission Critical Facilities," White Paper #55, Revision 1, 2003 American Power Conversion, Rev 2003-0, pp. 1-13.

Neil Rasmussen, "Avoidable Mistakes that Compromise Cooling Performance in Data Centers and Network Rooms," White Paper #49, 2003 American Power Conversion, Rev 2003-0, pp. 1-15.

Neil Rasmussen, "Cooling Options for Rack Equipment with Side-to-Side Airflow," White Paper #50, 2004 American Power Conversion, Rev 2004-0, pp. 1-14.

Neil Rasmussen, "Guidelines for Specification of Data Center Power Density," White Paper #120, 2005 American Power Conversion, Rev 2005-0, pp. 1-21.

Pinheiro, Eduardo, "Load Balancing and Unbalancing for Power and Performance in Cluster-Based Systems," Internet Citation, May 1, 2001 URL:http://research.ac.upc.es/pact01/colp/paper04.pdf, retrieved on Nov. 17, 2003.

Rittal Catalogue, Aug. 2005, p. 115 and p. 140.

Rittal, <http://www.rittal.com/services_support/downloads/brochures.asp>, download page for catalogue 31.

Rittal, Catalogue 31, front page p. 672 and back page, Apr. 2005.

Sharma, R.K, Bash, C.E., and Patel, C.D, "Dimensionless Parameters for Evaluation of Thermal Design and Performance of Large-Scale Data Centers." 8th ASME/AIAA Joint Thermophysics and Heat Transfer Conference, Jun. 24-26, 2002. St. Louis, Missouri.

Shrivastava S K et al., Optimization of Cluster Cooling Performance for Data Centers, Thermal and Thermomechanical Phenomena in Electronic Systems, May 28, 2008, pp. 1161-1166, 11th Intersociety Conference on, IEEE, Piscataway, NJ.

Thermodynamics: An Engineering Approach (Fourth Edition) Cengel et al. Published by McGraw Hill (c)2004.

Tony Evans, "Fundamental Principles of Air Conditioners for Information Technology," White Paper #57, Revision 1, 2004 American Power Conversion, Rev 2004-1, pp. 1-9.

Tony Evans, "Humidification Strategies for Data Centers and Network Rooms," White Paper 58, 2004 American Power Conversion, Rev 2004-0, pp. 1-13.

Tony Evans, "The Different Types of Air Conditioning Equipment for IT Environments," White Paper #59, 2004 American Power Conversion, Rev 2004-0, pp. 1-21.

Vangilder et al., "Airflow Uniformity thourhg Perforated Tiles in a Raised-Floor Data Center", White Paper 121, Jul. 17-22, 2005, 10 pages.

Vangilder, James W. et al., "Caputure index: an airflow-based rack cooling performance metric," 2007, ASHRAE Transactions, vol. 113, pp. 126-136.

Vangilder, James W. et al., "Real-Time prediction of rack-cooling performance," 2006, ASHRAE Transactions, vol. 112, pp. 151-162.

METHOD OF OPERATING A COOLING SYSTEM HAVING ONE OR MORE COOLING UNITS

RELATED APPLICATION

This application is a continuation of U.S. patent application Ser. No. 12/137,177, filed Jun. 11, 2008, entitled METHOD AND APPARATUS FOR COOLING, which is a continuation-in-part of U.S. patent application Ser. No. 11/504,370, filed Aug. 15, 2006, entitled METHOD AND APPARATUS FOR COOLING, both of which are incorporated herein by reference for all purposes.

BACKGROUND OF INVENTION

1. Field of Invention

Embodiments of the invention relate generally to devices and methods for cooling a room, such as a data center, equipment room or wiring closet. Specifically, aspects of the present invention relate to data centers containing racks and enclosures used to house data processing, networking and telecommunications equipment, and more particularly to cooling systems and methods used to cool equipment housed by such racks and enclosures.

2. Discussion of Related Art

Over the years, a number of different standards have been developed to enable equipment manufacturers to design rack mountable equipment that can be mounted in standard racks manufactured by different manufacturers. A standard rack typically includes front mounting rails to which multiple units of electronic equipment, such as servers and CPUs, are mounted and stacked vertically within the rack. An exemplary industry standard rack is approximately six to six-and-a-half feet high, by about twenty-four inches wide, and about forty inches deep. Such a rack is commonly referred to as a "nineteen inch" rack, as defined by the Electronics Industries Association's EIA-310-D standard.

Nineteen inch racks are used extensively in the data centers and other large facilities described above. With the proliferation of the Internet, it is not uncommon for a data center to contain hundreds of these racks. Further, with the ever decreasing size of computer equipment, and in particular, computer servers and blades, the number of electrical devices mounted in each rack has been increasing, raising concerns about adequately cooling the equipment.

Heat produced by rack-mounted equipment can have adverse effects on the performance, reliability and useful life of the equipment components. In particular, rack-mounted equipment, housed within an enclosure, may be vulnerable to heat build-up and hot spots produced within the confines of the enclosure during operation. The amount of heat generated by a rack of equipment is dependent on the amount of electrical power drawn by equipment in the rack during operation. In addition, users of electronic equipment may add, remove, and rearrange rack-mounted components as their needs change and new needs develop.

Previously, in certain configurations, data centers have been cooled by computer room air conditioner ("CRAC") units that are typically hard piped, immobile units positioned around the periphery of the data center room. These CRAC units intake air from the fronts of the units and output cooler air upwardly toward the ceiling of the data center room. In other embodiments, the CRAC units intake air from near the ceiling of the data center room and discharge cooler air under a raised floor for delivery to the fronts of the equipment racks. In general, such CRAC units intake room temperature air (at about 72° F.) and discharge cold air (at about 55° F.), which is blown into the data center room and mixed with the room temperature air at or near the equipment racks.

The rack-mounted equipment typically cools itself by drawing air along a front side or air inlet side of a rack, drawing the air through its components, and subsequently exhausting the air from a rear or vent side of the rack. A disadvantage of the CRAC-type air conditioning system is that cool air is mixed with the room temperature air, which is inefficient. Ideally, to make the system as efficient as possible, and to utilize as little energy and floor space as possible, the highest possible temperature air should be drawn into the CRAC units and the outlet air generated by the CRAC should be a few degrees below room temperature. In addition, airflow requirements can vary considerably as a result of different numbers and types of rack-mounted components and different configurations of racks and enclosures.

For large data centers requiring CRAC units at or near the middle or center of the data center room, delivery of coolant to the CRAC units must be located within the raised floor since it is undesirable to secure coolant piping to the ceiling of the data center due to risks involved with the possible failure of the piping joints. Specifically, with traditional CRAC systems, the piping of the units requires significant cutting and hand soldering of pipes. Leaks are common and leaking water or coolant in a data center may result in risk of damage to equipment housed within the equipment racks. For at least these reasons, most data center designers and operators are unwilling to consider overhead piping for cooling a data center.

SUMMARY OF INVENTION

One aspect of the invention is directed to a method of calculating sensible cooling capacity of a cooling unit. In a certain embodiment, the method comprises: obtaining compressor capacity; subtracting compressor heat loss from the compressor capacity; subtracting latent cooling capacity from compressor capacity; and subtracting fan power loss from the compressor capacity. Embodiments of the method may further comprise optimizing the capacity of the cooling unit by measuring a parameter of the cooling unit and manipulating a component of the cooling unit based on the measured parameter. The method may further comprise sensing inlet air temperature of air entering into the cooling unit and sensing the outlet air temperature of air exiting the cooling unit. The method may also comprise controlling air flow rate of air entering into the cooling unit.

Another aspect of the invention is directed to a cooling unit comprising a compressor to provide coolant under pressure, a condenser in fluid communication with the compressor, and a first air moving device configured to move a volume of air over the condenser. The first air moving device comprises a variable speed fan to vary the volume of air being delivered over the condenser. The cooling unit further comprises an evaporator in fluid communication with the condenser and the compressor, a first sensor positioned to obtain a reading of the condenser, and a controller in communication with the compressor. The condenser, the first air moving device, the evaporator and the first sensor, the controller may be configured to control the speed of the fan of the first air moving device in response to readings detected by the first sensor. Embodiments of the cooling unit may further comprise a second air moving device configured to move air over the evaporator and a second sensor positioned to obtain a reading of the evaporator. The controller may be configured to control the speed of the fan of the second air moving device in response to readings detected by the second sensor.

An additional aspect of the invention is directed to a cooling unit comprising a compressor to provide coolant under pressure, a condenser in fluid communication with the compressor, an evaporator in fluid communication with the condenser and the compressor, and a first air moving device configured to move a volume of air over the evaporator. The first air moving device comprises a variable speed fan to vary the volume of air being delivered over the evaporator. The cooling unit further comprises a first sensor positioned to obtain a reading of the evaporator and a controller in communication with the compressor. The condenser, the evaporator, the first air moving device, and the first sensor, the controller may be configured to control the speed of the fan of the first air moving device in response to readings detected by the first sensor.

Another aspect of the invention is directed to a method of controlling coolant flow through a condenser of a cooling unit. In one embodiment, the method comprises: measuring a parameter of the condenser; and decreasing coolant flow through the condenser by diverting coolant from the condenser to an evaporator when the measured parameter is above a predetermined threshold. In a particular embodiment, the parameter is pressure of coolant flowing from the condenser.

A further aspect of the invention is directed to a method of providing rapid coolant pressure equalization between a condenser and an evaporator of a cooling unit, with the condenser and the evaporator being in fluid communication with a compressor of the cooling unit. In an embodiment, the method comprises: manipulating the operation of the compressor between operable and inoperable states; measuring parameters of the condenser and the evaporator; and diverting coolant from the condenser to the evaporator to maintain the parameter below a predetermined threshold when the compressor is in the inoperable state. In a certain embodiment, the parameter is a pressure differential of coolant between the condenser and the evaporator when the compressor is in the inoperable state.

Another aspect of the invention is directed to a method of improving the circulation of coolant flowing in a cooling unit configured to have coolant flowing from a condenser to an evaporator, from the evaporator to a compressor, and from the compressor back to the condenser of a cooling unit, with a bypass valve being positioned between the condenser and the evaporator of the cooling unit to divert coolant flowing from the condenser to the evaporator back to the condenser. The method comprises: measuring a parameter of the bypass valve; and manipulating the operation of the bypass valve when the parameter is above a predetermined threshold. In a particular embodiment, the parameter is a position of the bypass valve.

A further aspect of the invention is directed to a method of controlling air flow over a condenser comprising: measuring a parameter of the condenser; increasing the air flow over the condenser when the measured parameter is above a first predetermined threshold; and decreasing the air flow over the condenser when the measured parameter is below a second predetermined threshold. In one embodiment, the parameter is pressure of coolant flowing from the condenser.

Yet another aspect of the invention is directed to a method of controlling air flow over an evaporator comprising: measuring a parameter of the evaporator; increasing air flow over the evaporator when the measured parameter is below a first predetermined threshold; and decreasing air flow over the evaporator when the measured parameter is above a second predetermined threshold. In one embodiment, the parameter is pressure of coolant flowing from the evaporator.

Another aspect of the invention is directed to a method of controlling air flow within a cooling unit having a condenser and an evaporator. In one embodiment, the method comprises: measuring a parameter of coolant flowing from the condenser; increasing the air flow over the condenser when the parameter of coolant is above a first predetermined threshold; decreasing the air flow over the condenser when the parameter of coolant is below a second predetermined threshold; measuring a parameter of coolant flowing from the evaporator; increasing air flow over the evaporator when the parameter of coolant is below a third predetermined threshold; and decreasing air flow over the evaporator when the parameter of coolant is above a fourth predetermined threshold. In a certain embodiment, any of the predetermined thresholds is one of pressure and temperature.

A further aspect of the invention is directed to a method of controlling a modular, self-contained cooling unit. The method comprises directing air over a first heat exchanger of the cooling unit to cool coolant flowing through the first heat exchanger; directing the cooled coolant from the first heat exchanger to a second heat exchanger; directing air over the second heat exchanger to cool the air; exhausting the cooled air out of the cooling unit; and diverting a portion of coolant being directed from the second heat exchanger to the first heat exchanger back to the second heat exchanger. In one embodiment, directing air over the second heat exchanger comprises varying the speed of air. In another embodiment, diverting a portion of coolant and varying the speed of air are controlled by a PID control of a controller.

A further aspect of the invention is directed to a cooling unit comprising a housing, a compressor coupled to the housing, a first heat exchanger coupled to the housing, at least one first air moving device coupled to the housing and configured to direct air over the first heat exchanger, a second heat exchanger coupled to the housing; and at least one second air moving device coupled to the housing and configured to direct air over the second heat exchanger. The second air moving device comprises at least one variable speed fan. The cooling unit further comprises a conduit system in fluid communication with the compressor, the first heat exchanger, the second heat exchanger, and the compressor. In a certain embodiment, the cooling unit further comprises a bypass valve provided in the conduit system. The bypass valve may be configured to divert a portion of coolant from the compressor to the second heat exchanger. In another embodiment, the first heat exchanger comprises a condenser unit and the second heat exchanger comprises an evaporator unit. The cooling unit may further comprise a controller to control the operation of the bypass valve.

Another aspect of the disclosure is directed to a method of calculating net sensible cooling capacity of a cooling unit of the type comprising a compressor, a condenser in fluid communication with the compressor, a thermal expansion valve in fluid communication with the condenser, an evaporator in fluid communication with the thermal expansion valve, and a hot gas bypass valve in fluid communication with the compressor and the evaporator. In one embodiment, the method comprises: measuring a discharge pressure from of fluid from the compressor and a suction pressure from the evaporator; calculating a condensing temperature of fluid flowing from the compressor and an evaporating temperature of fluid flowing from the evaporator; calculating a mass flow rate of fluid flowing from the compressor; calculating enthalpy of fluid flowing from the compressor, of fluid flowing from the thermal expansion valve, and of fluid flowing from the evaporator; calculating a mass flow rate of fluid flowing through the hot gas bypass valve; and calculating net sensible cooling capacity.

Embodiments of the method may include calculating net sensible cooling capacity by employing the following equation:

$$P_c = (Q_{total} - Q_{comp\ loss} - 1052.6 * C * 0.2928104 - P_f)/1000$$

where
- $P_c$—net sensible cooling capacity (kW);
- $Q_{total}$—total cooling capacity (W);
- $Q_{comp\ loss}$—compressor heat loss (W);
- C—condensate production rate (lbs/hr);
- 1052.6—amount of energy required to condense one pound of water;
- 0.2928104—converts BTU/hour to Watts; and
- 1000—converts Watts to Kilowatts.

Total cooling capacity may be determined by employing the following equations:

$$Q_{total} = M * (h_{suction\ gas} - h_{mix\ evaporator\ inlet});$$

and $$h_{mix\ evaporator\ inlet} = (M_{bypass} * h_{hot\ gas} + (M - M_{bypass}) * h_{liquid})/M,$$

where
- $Q_{total}$—total cooling capacity (W);
- M—refrigerant mass flow rate calculated via using ARI-540 mass flow rate coefficients (kg/sec);
- $h_{suction\ gas}$—enthalpy of the gas refrigerant at evaporator coil inlet (W/kg);
- $h_{mix\ evaporator\ inlet}$—enthalpy of the mixed refrigerant at evaporator coil inlet (W/kg);
- $M_{bypass}$—refrigerant mass flow rate bypassed through bypass valve (kg/sec);
- $h_{hot\ gas}$—enthalpy of the hot gas refrigerant at compressor outlet (W/kg); and
- $h_{liquid}$—enthalpy of the liquid refrigerant at expansion valve inlet (W/kg).

Calculating net sensible cooling may comprise calculating total cooling. The method may further comprise measuring a parameter of the bypass valve, and manipulating the operation of the bypass valve when the parameter is above a predetermined threshold. The parameter may be a position of the bypass valve. In another embodiment, the parameter is a pressure differential. Determining the pressure differential may be achieved by measuring the pressure of fluid flowing through a discharge pressure sensor and measuring the pressure of fluid flowing from through a suction pressure sensor.

A further aspect of the disclosure is directed to a cooling unit comprising a housing, a compressor coupled to the housing, a first heat exchanger coupled to the housing, a second heat exchanger coupled to the housing, a thermal expansion valve configured to control the delivery of fluid to the second heat exchanger, a conduit system in fluid communication with the compressor, the first heat exchanger, the second heat exchanger, the thermal expansion valve, and the compressor, a bypass valve provided in the conduit system, the bypass valve being configured to divert a portion of coolant from the compressor to the second heat exchanger, and a controller to control the operation of the thermal expansion valve and the bypass valve. The controller may be configured to calculate net sensible cooling capacity of the cooling unit based on parameters taken from the cooling unit. Embodiments of the cooling unit may further comprise at least one first air moving device coupled to the housing and configured to direct air over the first heat exchanger, and at least one second air moving device coupled to the housing and configured to direct air over the second heat exchanger. The second air moving device may comprise at least one variable speed fan. The first heat exchanger may comprise a condenser unit and the second heat exchanger may comprise an evaporator unit.

A further aspect of the disclosure is directed to a cooling unit comprising a compressor, a first heat exchanger in fluid communication with the compressor, a second heat exchanger in fluid communication with the compressor and the first heat exchanger, a thermal expansion valve configured to control the delivery of fluid to the second heat exchanger, a bypass valve in fluid communication with the compressor and the first heat exchanger, the bypass valve being configured to divert a portion of coolant from the compressor to the second heat exchanger, and a controller to control the operation of the thermal expansion valve and the bypass valve. The controller may be configured to calculate net sensible cooling capacity of the cooling unit based on parameters taken from the cooling unit.

Embodiments of the cooling unit may further comprise at least one first air moving device coupled to the housing and configured to direct air over the first heat exchanger, and at least one second air moving device coupled to the housing and configured to direct air over the second heat exchanger, the second air moving device comprising at least one variable speed fan. In one embodiment, the first heat exchanger comprises a condenser unit and the second heat exchanger comprises an evaporator unit.

Yet another aspect of the disclosure is directed to a cooling unit comprising a compressor, a condenser in fluid communication with the compressor, a thermal expansion valve in fluid communication with the condenser, an evaporator in fluid communication with the thermal expansion valve, a hot gas bypass valve in fluid communication with the compressor and the evaporator, and a controller coupled to a plurality of temperature and pressure sensing devices disposed between the compressor and the condenser and the evaporator and the compressor. In one embodiment, the controller is configured to calculate a condensing temperature of fluid flowing from the compressor and an evaporating temperature of fluid flowing from the evaporator, calculate a mass flow rate of fluid flowing from the compressor, calculate enthalpy of fluid flowing from the compressor, of fluid flowing from the thermal expansion valve, and of fluid flowing from the evaporator, calculate a mass flow rate of fluid flowing through the hot gas bypass valve. The method may calculate net sensible cooling capacity. The processor may be further configured to process a measurement of a discharge pressure from of fluid from the compressor and a suction pressure from the evaporator.

Embodiments of the method include calculating the mass flow rate of fluid flowing through the hot gas bypass valve by measuring the pressure differential across the hot gas bypass valve and employing a formula created for refrigeration systems having hot gas bypass valves. Determining the pressure differential may be achieved by measuring the pressure of fluid flowing through a discharge pressure sensor and measuring the pressure of fluid flowing from through a suction pressure sensor.

Another aspect of the disclosure is directed to a computer readable medium having stored thereon sequences of instruction including instructions that will cause a processor to: process a measurement of a discharge pressure from of fluid from the compressor and a suction pressure from the evaporator; calculate a condensing temperature of fluid flowing from the compressor and an evaporating temperature of fluid flowing from the evaporator; calculate a mass flow rate of fluid flowing from the compressor; calculate enthalpy of fluid flowing from the compressor, of fluid flowing from the thermal expansion valve, and of fluid flowing from the evaporator; calculate a mass flow rate of fluid flowing through the hot gas bypass valve; and calculate net sensible cooling capacity.

Embodiments of the computer readable medium may include calculating the mass flow rate of fluid flowing through the hot gas bypass valve by measuring the pressure differential across the hot gas bypass valve and employing a formula created for refrigeration systems having hot gas bypass valves. Determining the pressure differential may be achieved by measuring the pressure of fluid flowing through a discharge pressure sensor and measuring the pressure of fluid flowing from through a suction pressure sensor.

BRIEF DESCRIPTION OF DRAWINGS

The accompanying drawings, are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
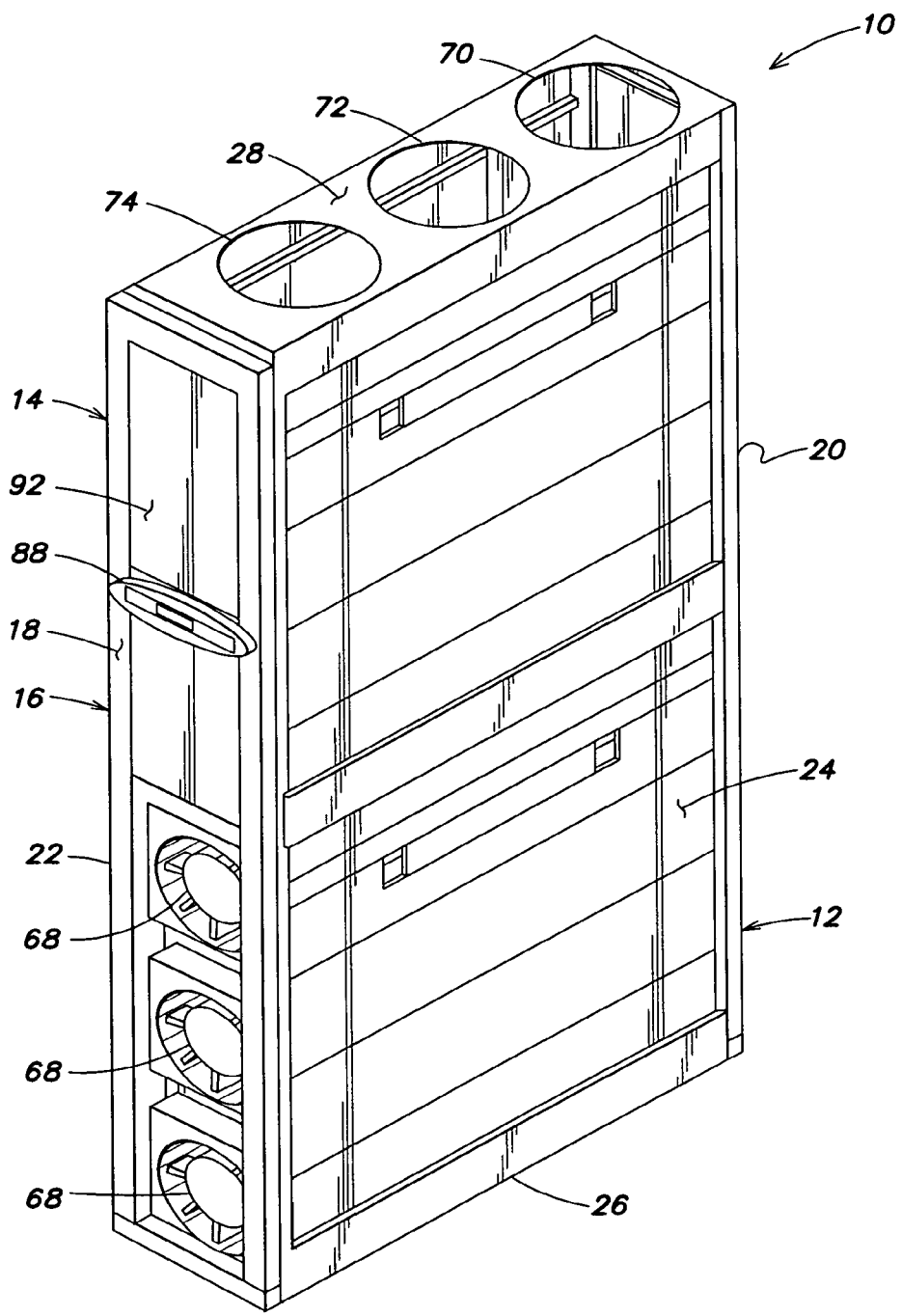
FIG. 1 is a perspective view of a cooling unit of an embodiment of the present invention.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing", "involving", and variations thereof herein, is meant to encompass the items listed thereafter and equivalents thereof as well as additional items.

At least one embodiment of the present invention is directed to a modular cooling system that is selectively configurable to cool electronic equipment housed within equipment enclosures or racks of a data center. As used herein, "enclosures" and "racks" are used to describe apparatus designed to support electronic equipment. Such a cooling system is capable of employing one or more cooling units on an as needed basis to provide localized cooling within the data center. Specifically, multiple cooling units may be interspersed in a row of equipment racks to more efficiently cool the data center. The circulation path of warm air generated by the electronic equipment is greatly reduced, thereby nearly eliminating the mixing of hot and cold air within the data center.

Data centers are typically large rooms designed, in certain instances, to house hundreds of electronic equipment racks arranged in rows within the data center. The rows of equipment racks are arranged in such a manner that there are cold aisles and hot aisles. The cold aisles provide access to the fronts of the enclosures where the electronic equipment is typically accessed. The hot aisles provide access to the backs of the equipment racks. As requirements change, the number of equipment racks may be increased or decreased depending on the functional requirements of the data center. At least one embodiment of the cooling system is modular and scalable, and may take the form of a kit designed to meet these changing needs. Also, although relatively large data centers are discussed as an intended use for such a cooling system, as mentioned above, the system of the present invention is scalable and may be employed in smaller rooms on a smaller scale and for applications other than data center.

In one embodiment, the cooling system may comprise a plurality of cooling units, each cooling unit having a housing adapted to support components of the cooling system. For example, the components of the cooling unit may include first and second heat exchangers coupled to a conduit system configured to deliver coolant to the heat exchangers. Fans may be provided to move air across the heat exchangers. The cooling unit may be disposed within a row of equipment racks and configured to intake the hot air within the data center from a hot aisle, for example, to cool the air to slightly below ambient temperature. This configuration eliminates the inefficiency of mixing hot air with the room temperature air to obtain a warm air mixture. This configuration may also decrease the latent cooling provided by the data center's air conditioning system thereby decreasing the need for humidification.

In certain embodiments, the components of the cooling unit may be provided in kit form so that the person installing the cooling unit does not require specialized tools. The modular nature of the cooling unit allows the user to optimize the location of each cooling unit since each cooling unit includes the ability to sense and display the capacity of the system, the flow rate, coolant and air inlet and outlet temperatures, and pressure differentials obtained from pressure readings taken throughout the cooling unit. Thus, the cooling unit may be employed and redeployed for maximum efficiency and optimal use within the data center.

A typical data center includes a room designed to house a plurality of equipment racks. In one embodiment, each equipment rack may be constructed in accordance with the teachings disclosed in U.S. patent application Ser. No. 10/990,927, entitled EQUIPMENT ENCLOSURE KIT AND ASSEMBLY METHOD, filed on Nov. 17, 2004, which is owned by the assignee of the present invention and is incorporated herein by reference. Further, cabling between the equipment racks may be implemented using cable distribution troughs contained on the roofs of the racks as disclosed in U.S. Pat. No. 6,967,283, which is incorporated herein by reference and assigned to the assignee of the present invention.

Specifically, the equipment rack includes a frame or housing adapted to support electronic components, such as data processing, networking and telecommunications equipment. The housing includes front, back, sides, bottom and top. The front of each equipment rack may include a front door so as to enable access into the interior of the equipment rack. A lock may be provided to prevent access into the interior of the equipment rack and the equipment housed by the rack. The sides of the equipment rack may include at least one panel configured to cover a side to enclose the interior region of the rack. The back of the equipment rack may also include at least one panel or a back door to provide access to the interior of the equipment rack from the back of the rack. In certain embodiments, the side and back panels, as well as the front door and the rear door, may be fabricated from perforated sheet metal, for example, to allow air to flow into and out of the interior region of the equipment rack. Otherwise, the panels may be fabricated from solid material.

The equipment racks are modular in construction and configured to be rolled into and out of position, e.g., within a row of the data center. Casters are secured to the bottom of each equipment rack to enable the rack to roll along the floor of the data center. Once positioned, leveling feet may be deployed to securely ground the equipment rack in place within the row. An example of casters and leveling feet employed on such an equipment rack is disclosed in detail in U.S. patent application Ser. No. 10/990,927.

Once in position, electronic equipment may be positioned in the interior region of the equipment rack. For example, the equipment may be placed on shelving secured within the interior region of the equipment rack. Cables providing electrical and data communication may be provided through the top of the equipment rack either through a cover (or "roof" as described in U.S. Pat. No. 6,967,283) at the top of the equipment rack having openings formed therein or through an open top of the equipment rack. In this embodiment, the cables may be strung along the roofs of the rack or be provided in the aforementioned cable distribution trough. In another embodiment, the cables may be disposed within a raised floor and connected to the electronic equipment through the bottom of the equipment rack. With both configurations, power and communication lines are provided to the equipment racks.

As discussed above, data centers are typically configured with rows of equipment racks arranged such that cool air is drawn into the racks from a cool aisle and warm or hot air is exhausted from the racks into a hot aisle. The equipment racks may be arranged in two rows with the fronts of the equipment racks in a near row being arranged in a forward direction and the backs of the equipment racks in a far row being arranged in a rearward direction. However, as stated above, in a typical data center, there are multiple rows of equipment racks wherein the rows may be arranged with the fronts of the equipment racks facing one another to define the cold aisle and with the backs of the equipment racks facing one another to define the hot aisle.

In order to address the heat build-up and hot spots within the data center, and to address climate control issues within the data center in general, a modular cooling unit is provided in one embodiment. As discussed above, due to cooling requirements within the data center or room, a plurality of cooling units may be provided. In one embodiment, the arrangement is such that there is a cooling unit for every two equipment racks provided in the data center. However, it should be understood that a person of ordinary skill in the art, given the benefit of this disclosure, may provide more or less cooling units within the data center based on environmental conditions of the data center. Further in some embodiments, the concentration and locations of cooling units may be adjusted based on the locations of the hottest racks in the data center, or based on information obtained and analyzed by a data center information management system. Additionally, cooling units of embodiments of the invention may be used in combination with other types of cooling systems, such as cooling systems of the types disclosed in U.S. patent application Ser. Nos. 11/335,874, 11/335,856 and 11/335,901, each entitled COOLING SYSTEM AND METHOD and filed on Feb. 10, 2006, which are owned by the assignee of the present invention and incorporated herein by reference.

A cooling unit of embodiments of the invention may be configured to have two sections or modules, which together define a closed loop cooling system that may be configured within a data center, equipment room or wiring closet to cool electrical components housed by equipment storage racks. In one embodiment, a lower module of the cooling unit includes a set of evaporator fans that are configured to draw heated air taken from a "hot" aisle, for example, which is generated by the electrical components. This heated air is drawn through an evaporator having a coil containing a coolant medium (e.g., a refrigerant) to cool the air. The arrangement is such that warm air drawn into the lower module by the evaporator fans flows over the evaporator to cool the air. The cooled air is forced back into the environment through a front of the cooling unit. Based on cooling requirements, other airflow patterns may be provided.

The heat absorbed by the coolant contained in the coil of the evaporator is transported to an upper module, which rests on the lower module. This upper module has a condenser adapted to cool the heated coolant delivered to the upper module from the lower module. In addition to the condenser, the upper module includes a set of condenser fans and a first, generally vertical plenum that is in fluid communication with an opening formed in a top of the upper module to draw relatively cooler air into the upper module. A second, generally horizontal plenum takes air directed by the first plenum to the set of condenser fans, which directs the air over the condenser. The relatively cooler air is heated as it flows over the condenser. Once heated, the air flows through one of two openings formed in the top of the upper module. The liquid coolant is directed back to the evaporator, where the cycle begins again. A compressor, such as a rotary compressor, pumps evaporated coolant from the evaporator to the condenser. The compressor, evaporator fans and condenser fans are all controlled by a controller. In one embodiment, to improve capacity control and efficiency, warmer coolant being delivered by the compressor unit to the condenser may be diverted to the evaporator by a bypass valve.

It should be understood that, in embodiments of the invention, the lower module may be configured to perform the condensing function described above and the lower module may be configured to perform the evaporating function described above.

In one embodiment, the controller is adapted to control the operation of the cooling system based on environmental parameters obtained by the controller. Generally speaking with prior cooling systems, the individual cooling units can not communicate with one another. For example, the controller may embody a plurality of controllers provided in the cooling units that communicate with one another over a controller area network (CAN) Bus. In other embodiments, a master controller may be provided to control the operation of the controllers of the cooling units. Each cooling unit may be provided with a display, which is operably coupled to the controller. The display is adapted to display the environmental conditions of the data room, such as, and not limited to, the temperature and the humidity of the data center at the cooling unit, the temperature of the air entering into and exiting out of the cooling unit, the temperature of coolant entering into and exiting out of the cooling unit, the flow rate of coolant entering the cooling unit, and the cooling capacity of the cooling unit. Suitable monitors and/or gauges may be provided to acquire such information. Alternatively, or in addition to the foregoing embodiment, the environmental conditions may be displayed on a unit provided with an integrated data center control and monitoring system.

Referring now to FIGS. 1-6, and more particularly to FIG. 1, there is generally indicated at 10 a cooling unit of an embodiment of the invention. As shown, the cooling unit 10 comprises a lower module 12 and an upper module 14 configured to treat air within a room. In one embodiment, the cooling unit 10 includes a frame or housing 16, which may be configured in two separate housings forming the frames of the lower and upper modules, or as a single, unitary housing. The cooling unit 10 includes a front 18, a back 20, opposite sides 22, 24, a bottom 26 and a top 28. Each side 22, 24 of the cooling unit may include at least one panel (not designated) configured to cover the side to enclose the interior region of the cooling unit. The front and the back of the cooling unit may include at least one removable panel or door to provide access to the interior of the cooling unit. In certain embodiments, the front and back panels may be fabricated from perforated sheet metal, for example, to allow air to flow into and out of the interior region of the cooling unit. Casters and leveling feet (both not shown) may be provided to enhance the mobility of the cooling unit and to set the cooling unit in a secure position. Other details of the cooling unit 10 shown in FIG. 1 will be discussed in greater detail below as the description of the cooling unit proceeds.

Figure 2:
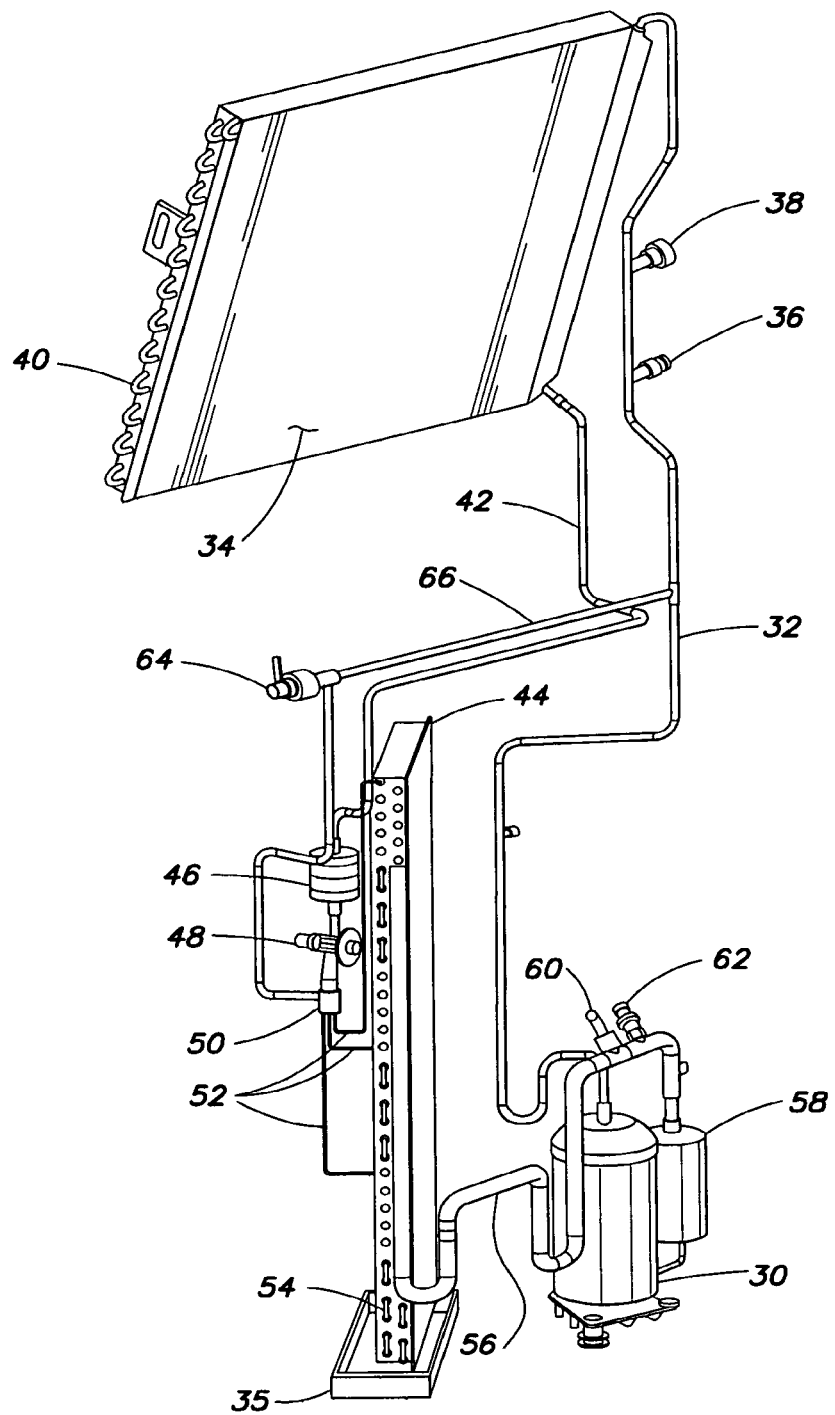
FIG. 2 is a perspective view of components of the cooling unit shown in FIG. 1.

Turning to FIG. 2, the internal components of the cooling unit 10 are illustrated without showing the housing 16 and panels of the cooling unit. The components of the cooling unit 10 are suitably secured to and contained within the housing 16 of the cooling unit in the manner shown and described herein. The air flow within the cooling unit will be discussed in greater detail below with reference to other drawings, including FIG. 6 in particular. One purpose of FIG. 2 is to illustrate the flow of a coolant medium (e.g., a liquid coolant, such as R134A and R410A coolants) through the working components of the cooling unit.

As shown, a compressor 30 is provided for delivering hot gas coolant under pressure to the components of the cooling unit 10. The pressurized coolant travels through a discharge pipe 32, which connects the compressor 30 to a condenser 34. A temperature sensor (not shown) and a first pressure transducer 36 may be provided adjacent to the condenser 34 to measure the temperature and the pressure of the coolant as it enters the condenser. The purpose of the temperature sensor and the pressure transducer 36 will be discussed in greater detail below. A high pressure switch 38 may be further provided to de-energize the compressor thereby stopping the delivery of coolant to the condenser should the coolant experience an out of tolerance pressure condition that requires power to the compressor to be cut off. The condenser 34 includes a coil 40 having thermally conductive fins (not shown) configured to cool the heated coolant within the coil of the condenser. The air flow over the condenser coil 40 will be discussed in greater detail below with reference to drawings directed to the air flow configuration of the cooling unit 10 (e.g., FIG. 6). Once the coolant is cooled within the condenser 34 (e.g., transitioning the coolant from an evaporated state to a condensed state), the coolant travels through another liquid pipe 42 to an evaporator 44. The coolant first travels through a filter drier 46 to eliminate impurities and to remove unwanted non-condensables within the coolant. Once through the filter drier 46, the coolant travels through a thermal expansion valve 48 to condition the coolant prior to entering the evaporator 44.

Next, the low pressure coolant enters a distributor 50 and is distributed to the evaporator by one of several (e.g., three) conduits, each indicated at 52 in FIG. 2. As shown, one conduit 52 delivers coolant to the evaporator 44 near the top of the evaporator. A second conduit 52 delivers coolant to a middle of the evaporator 44. And finally, a third conduit 52 delivers coolant to a bottom of the evaporator 44. This configuration ensures that coolant is evenly distributed to the evaporator 44, which is designed to include a coil 54 in thermal communication with metal fins (not shown) so that heat may be absorbed from relatively warm air flowing over the evaporator. Once heated by warm air passing over the evaporator 44, the evaporated coolant travels back to the compressor 30 via a section of suction piping 56. However, prior to entering the compressor 30, the coolant passes through a compressor suction accumulator 58, which ensures that coolant enters into the compressor 30 in an evaporated state. Another temperature sensor 60 and another pressure transducer 62 may be provided adjacent to the compressor 30, the purpose of which will be discussed in greater detail below. A condensate pan 35 may be disposed below the evaporator 44 to collect condensate generated by the evaporator.

The arrangement is such that high temperature coolant flows from the compressor 30 to the condenser 34. Pressure and temperature readings of the coolant are taken prior to the coolant entering the condenser 34. The condenser 34 cools the coolant by virtue of relatively cool air passing over the condenser coil 40. Once cooled, the coolant travels to the evaporator 44. A bypass valve 64 may be provided to divert coolant normally directed to the condenser 34 from the compressor 30 to the evaporator 44 via a discharge pipe 66. By opening the bypass valve 64 by means of a stepper motor provided with the bypass valve, for example, a portion of coolant traveling to the condenser is diverted to the evaporator by way of distributor 50. The operation of the bypass valve 64, which may sometimes be referred to as a hot gas bypass valve, may be manipulated to regulate the capacity of the cooling unit 10. As will be discussed in greater detail below, by closely monitoring the pressure and/or temperature of the coolant entering into the condenser 34, the efficiency of the cooling unit 10 may be optimized by bypassing coolant that travels from the condenser to the evaporator. In another configuration, two additional pressure sensors may be positioned adjacent to the inlet and the outlet of the hot gas bypass valve 64 to measure the flow rate through the hot gas bypass valve.

In one embodiment, the compressor may embody a rotary compressor, such as a 208-230/1/50 or 208-230/1/60 rotary compressor offered by Carrier of Syracuse, N.Y. When employing a rotary compressor, the pressure differential between the evaporating pressure and the condensing pressure, in certain embodiments, must be less than a predetermined pressure difference, such as 7.2 psig, to restart the compressor. To expedite the pressure equalization between evaporating and condensing pressures, the hot gas bypass valve 64 may be open until the compressor re-starts.

Figure 4:
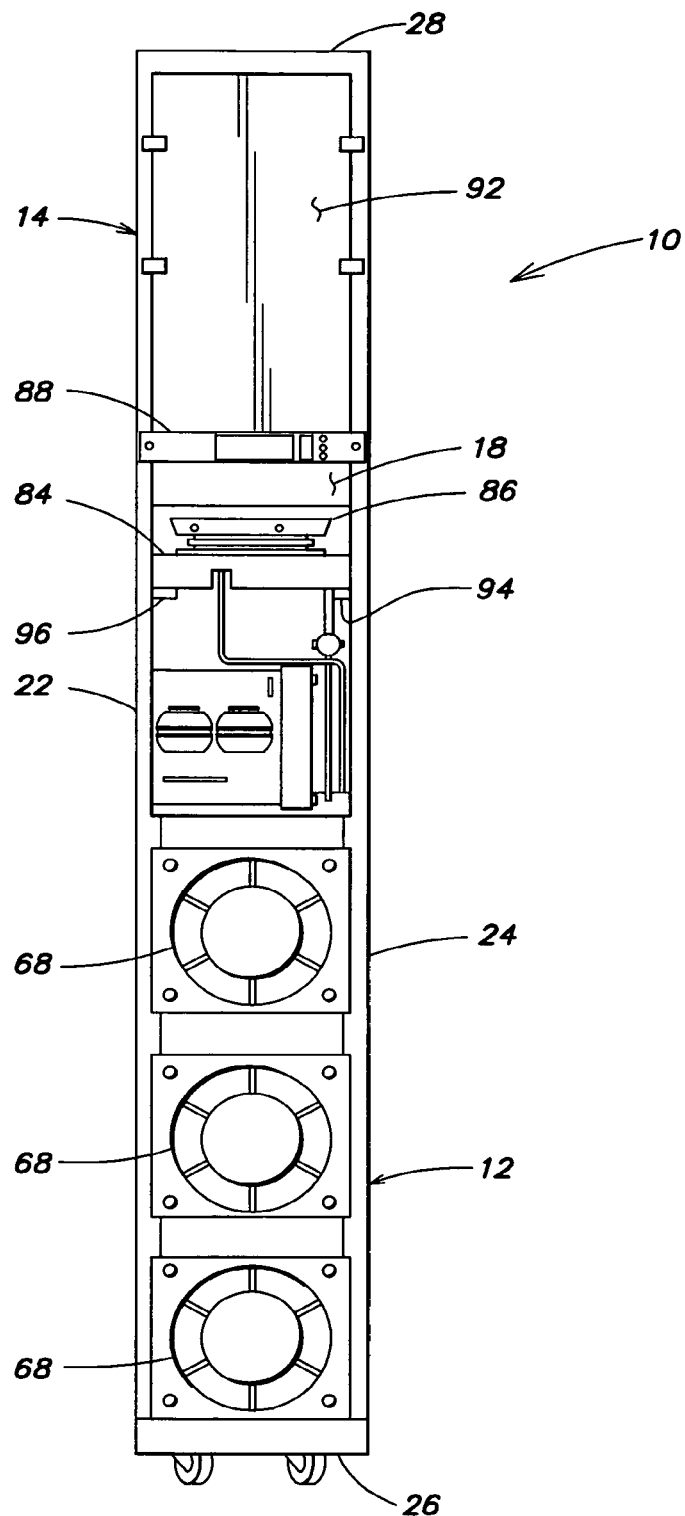
FIG. 4 is a view similar to FIG. 3 illustrating a bottom air blocking panel removed.
Figure 5:
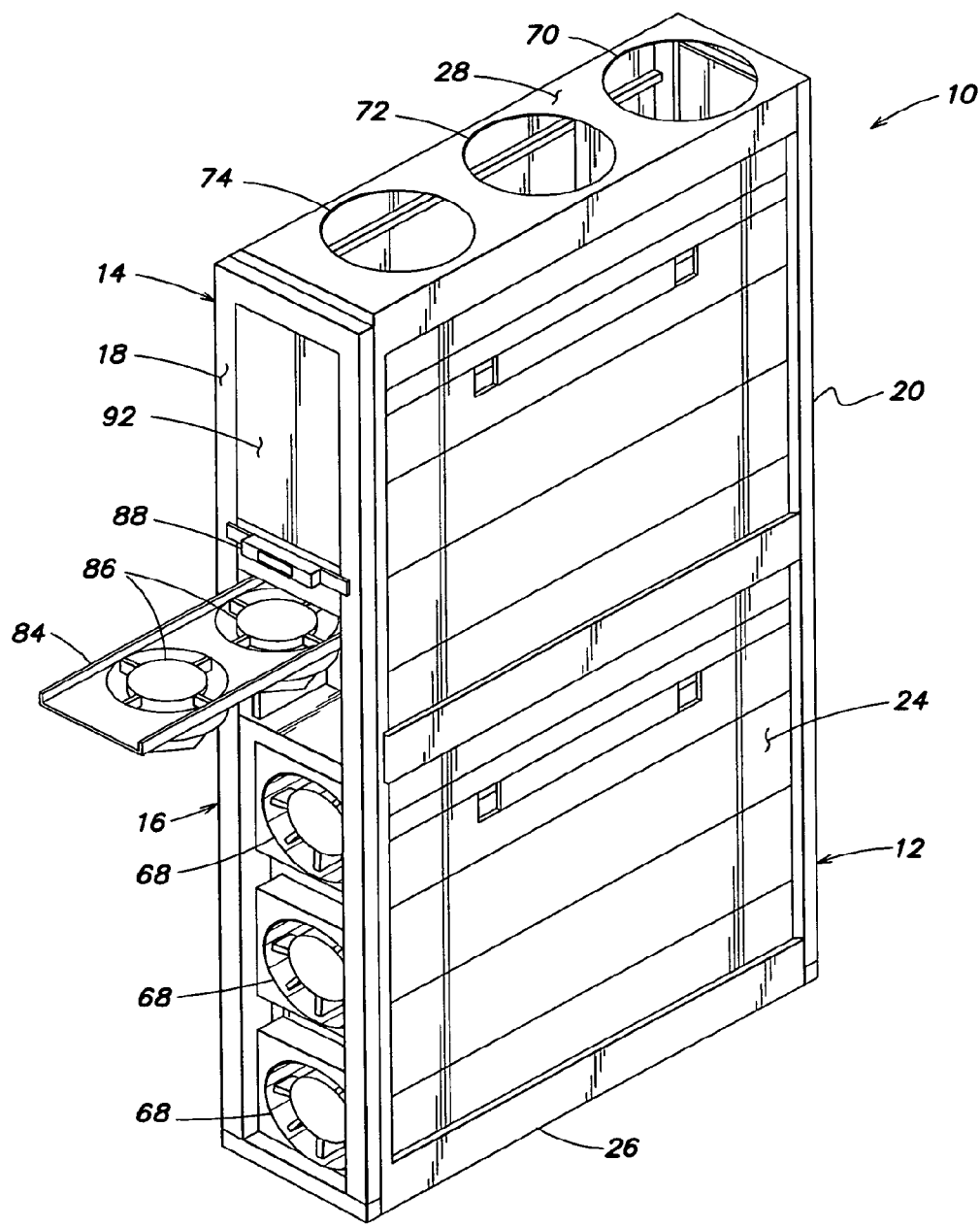
FIG. 5 is a perspective view of the cooling unit shown in FIG. 4 with a fan tray assembly partially removed from the cooling unit.
Figure 6:
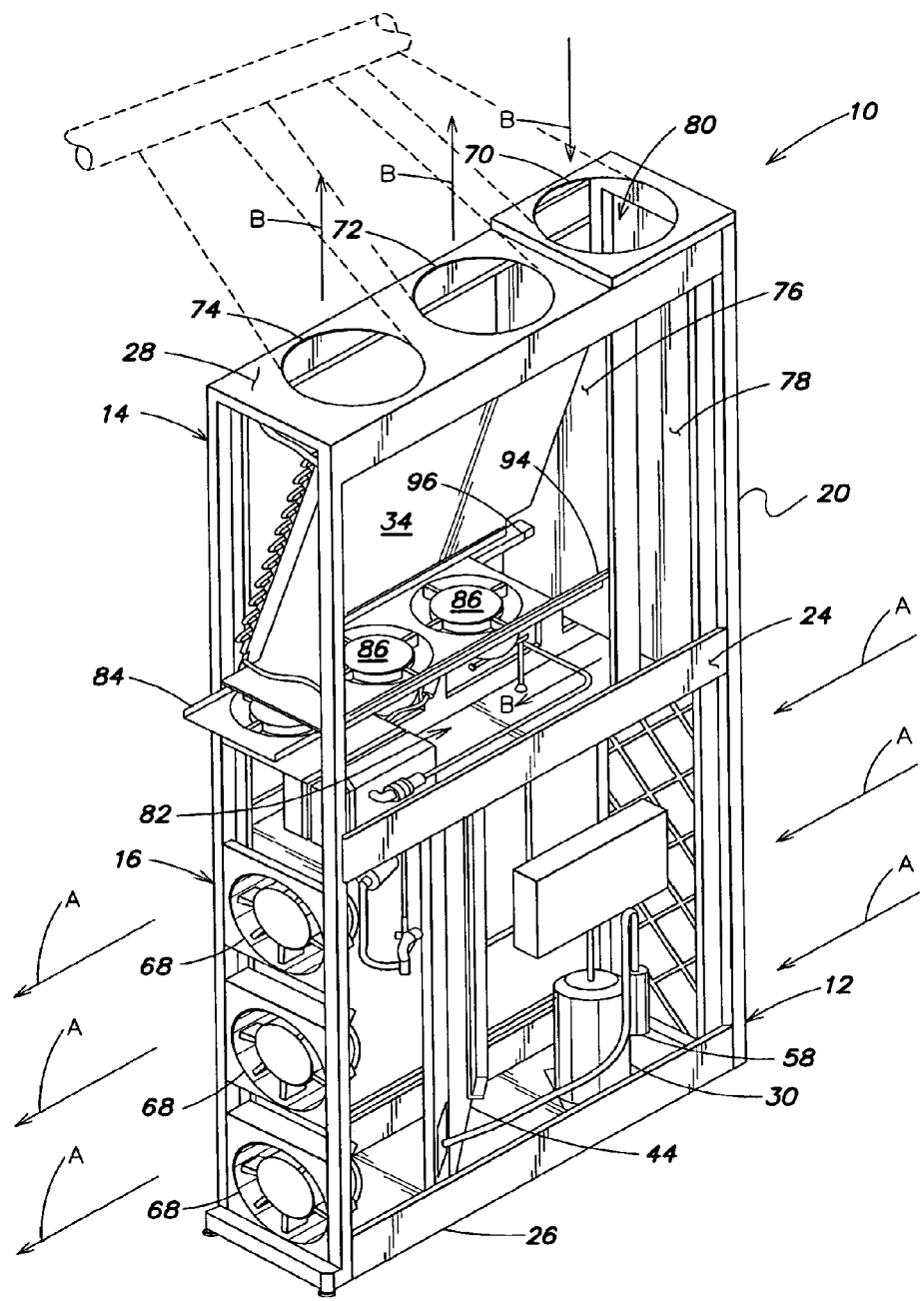
FIG. 6 is a perspective view similar to FIG. 1 with side panels of the cooling unit removed.

Referring to FIGS. 3-6, and more particularly to FIG. 6, the lower module 12 has a plurality of evaporator fans (sometimes referred to herein as air moving devices), each indicated at 68, which are located at the front of the lower module of the cooling unit 10. The arrangement is such that air may be drawn from the back of the lower module 12 of the cooling unit over the evaporator 44 through either an open back or through perforations in a back panel by the evaporator fans 68. In one embodiment, there may be three such fans 68 (as shown) to draw air through the lower module 12 in the manner shown in FIG. 6. However, any number of fans 68 may be employed, depending on the size of the fans and on how much air is required to be drawn across the evaporator 44. In one embodiment, the evaporator fans 68 may be 200 mm mixed flow fans provided by EBM Industries of Farmington, Conn. The evaporator fans 68 may be configured as part of a fan tray arrangement secured vertically to the front 18 of the cooling unit 10, or be secured individually to the housing 16 at the front 18 of the cooling unit. As shown best in FIG. 6, the air drawn through the lower module by the evaporator fans 68 (indicated by arrows A) flows over the coil and the fins of the evaporator 44 to heat the coolant flowing through the coil. The resultant is that cool air is blown out of the evaporator fans 68 at the front of the cooling unit 10 to cool the space adjacent the front of the cooling unit.

In one embodiment, one or more cooling units 10 may be positioned so that the backs 20 of the cooling units are adjacent a hot aisle. Depending on the cooling requirements of the data center, more than one cooling unit 10 may be provided to cool warm air deposited in the hot aisle by the equipment enclosures.

In a particular configuration, the upper module 14 of the cooling unit 10 may be configured to include the top 28 of the cooling unit, which has three openings formed therein. Specifically, there may be provided an intake opening 70 and two exhaust openings 72, 74 in the top 28 of the cooling unit 10. As best shown in FIG. 6, an interior wall 76 and a blocking panel 78 define a first plenum 80 that extends along a generally vertical axis. The first plenum 80 is in fluid communication with the intake opening 70 to draw air from the intake opening to a second plenum 82 located along a generally horizontal axis at the bottom of the upper module 14.

Further provided in the upper module 14 is a tray 84 that is releasably secured to the housing of the cooling unit 10, the tray having three condenser fans, each indicated at 86, secured thereto. The arrangement is such that the tray 84 and the condenser fans 86 are disposed along a generally horizontal plane to define an upper wall of the second plenum 82. The condenser fans 86 are configured to draw relatively cool air from the first plenum 80 to the second plenum 82 and blow the air across the condenser 34 so as to cool coolant running through the condenser coil. Air flows through the condenser 34 and out of the two exhaust openings 72, 74 formed in the top 28 of the upper module 14 of the cooling unit 10. The airflow path through the upper module 14 is depicted by arrows B in FIG. 6. In one embodiment, the exhaust openings 72, 74 may be in fluid communication with exhaust ducts (not shown) to transfer the warm air out of the data center or room. In another embodiment, the air may be directed to the top of the data center or room, away from the equipment enclosures. In a further embodiment one exhaust opening or more than two exhaust openings may be provided. It should be understood that one skilled in the art, given the benefit of this disclosure, may configure the cooling unit in any desired manner consistent with the teachings herein.

As shown best in FIG. 6, the condenser fans 86 draw air from the intake opening 70 along a first flow path defined by the first and second plenums 80, 82 to the exhaust openings 72, 74, as indicated by arrows B. As shown in dashed lines, air may also be drawn from a dropped ceiling arrangement. The condenser 34 is positioned within the upper module 14 at an acute angle with respect to the first flow path. The evaporator fans 68 draw air from the intake opening defined by the open end 20 of the lower module 12 of the cooling unit 10 along a second flow path shown by arrows A to an exhaust opening defined by the opposite open end 18 of the lower module of the cooling unit. The evaporator 44 is positioned within the lower module 12 at an acute angle with respect to the second flow path. In the claims, the upper module 14 may be referred to as a first module and the lower module 12 may be referred to as a second module. The acute angles of the condenser 34 and the evaporator 44 may be selected to maximize the surface areas of the condenser and the evaporator, respectively.

In one embodiment, a controller may be operably coupled to a display unit 88 (see FIG. 1), such as a display unit shown and disclosed in U.S. patent application Ser. Nos. 11/335,874, 11/335,856 and 11/335,901 discussed above. In a certain embodiment, the display unit 88 has a liquid crystal display, for example, to display certain environmental conditions, such as temperature and humidity of the data center, the temperature of air entering into and exiting out of the cooling unit, the temperature of coolant entering into and exiting out of the evaporator and condenser of the cooling unit, and the flow rate of coolant within the cooling unit. A plurality of control buttons and status indicators are further provided on the display unit 88 to enable the operator to manipulate the operation of the cooling system and to quickly determine the status of a certain condition, respectively. As shown, the display unit 88 may be secured to the front 18 of the cooling unit 10 within an opening formed in the front of the cooling unit by means of a sealing gasket and a mounting bracket in which screw fasteners may be provided to secure the display assembly to the front panel within the opening.

Figure 3:
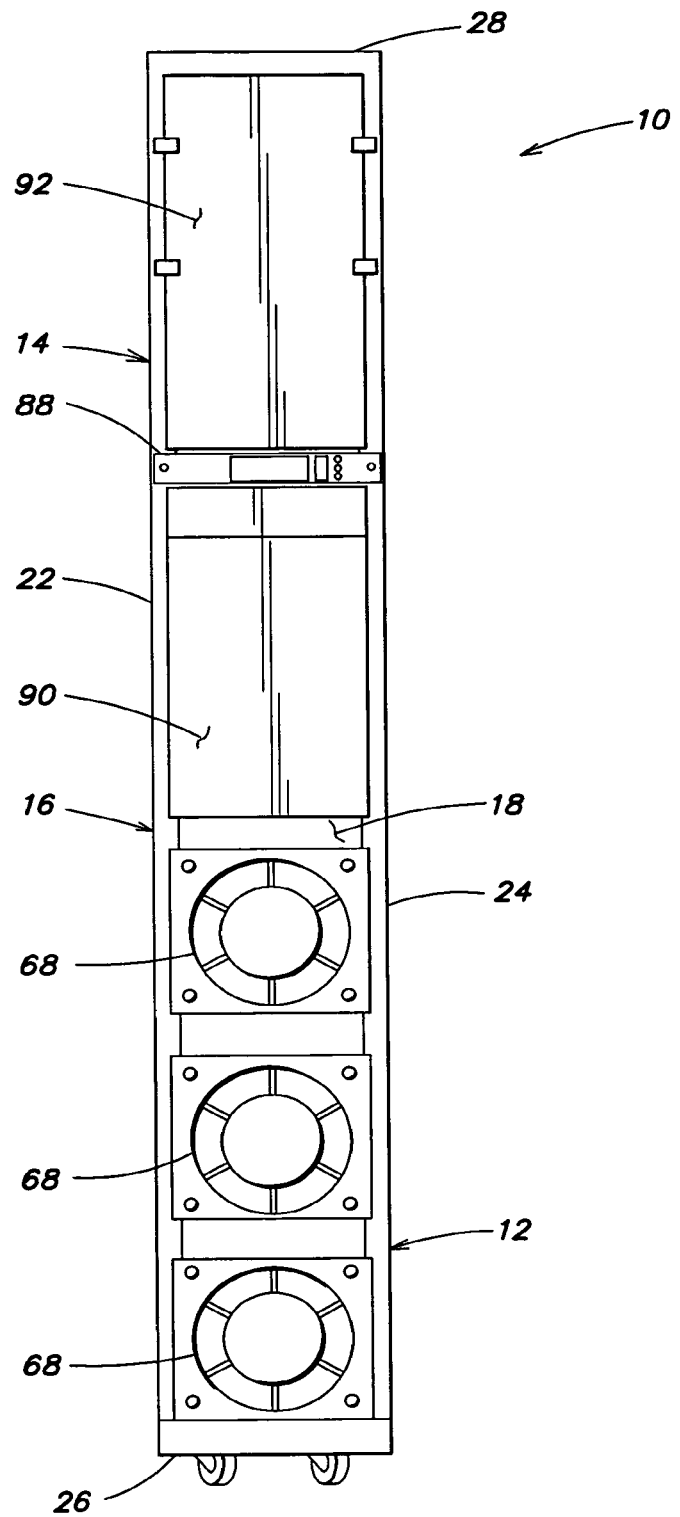
FIG. 3 is a front elevational view of the cooling unit with a front panel of the cooling unit removed.

FIGS. 3-5 illustrate the removal of the tray 84 having the condenser fans 86. Specifically, FIG. 3 illustrates the front panel or door of the cooling unit 10 removed from the cooling unit. As shown, the display unit 88 is secured to the housing 16 of the cooling unit. In a configuration having only one panel, the panel and the display unit 88 may be removed either together or separately, depending on the particular design. In the shown embodiment, at least two air blocking panels, 90, 92 are secured to the housing 16 of the cooling unit 10 to contain air within the upper module 14 of the cooling unit. FIG. 4 illustrates the lower air blocking panel 90 removed so that the second plenum 82 of the cooling unit is revealed. Once the lower air blocking panel 90 is removed, the fan tray 84 may be removed from the housing 16 of the cooling unit 10 by simply pulling the fan tray from the front of the cooling unit 10. The fan tray 84 is configured to rest on a pair of support rails 94, 96, which are secured to the housing 16 within the upper module 14 of the cooling unit 10. The condenser fans 86, as well as the evaporator fans 68, may be variable speed fans that are independently operable under the control of a controller. The arrangement is such that the fan tray 84 may be easily removed from the cooling unit 10 to replace or repair a fan, for example.

In other embodiments, as described above, the panels 90 and 92 may be combined to create a single panel. With this configuration, the display unit 88 must be separately removed so as to access the fan tray 84.

As mentioned above, a controller may be configured to control the operation of the cooling unit 10 as well as provide communication with external devices. In one embodiment, the controller may be a separately dedicated unit that controls the operation of multiple cooling units 10. In another embodiment, the controller may be provided in one of the cooling units 10, with the cooling unit having the controller functioning as the main cooling unit and the other cooling units functioning as subservient cooling units. In yet another embodiment, the operation of the cooling unit 10 may be operated under the control of an integrated data center control and monitoring system with each cooling unit having a controller unit that communicates with the other cooling units over the network. In one such embodiment, the controller may communicate with a data center control system to provide status of the components of the cooling system and to receive control commands for the data center control system. In one particular embodiment each cooling unit 10 includes a controller that communicates with the data center controller over a network, such as a CAN Bus network, and in one such embodiment, the data center controller may be implemented using the integrated data center control and monitoring system, such as the InfraStruXure™ data center manager sold by American Power Conversion Corporation of West Kingston, R.I., the assignee of the present invention. Notwithstanding the particular configuration, the controller is adapted to control the flow of coolant from the compressor 30 to the condenser 34 and the evaporator 44 depending on the temperature and pressure readings of the cooling unit.

Figure 7:
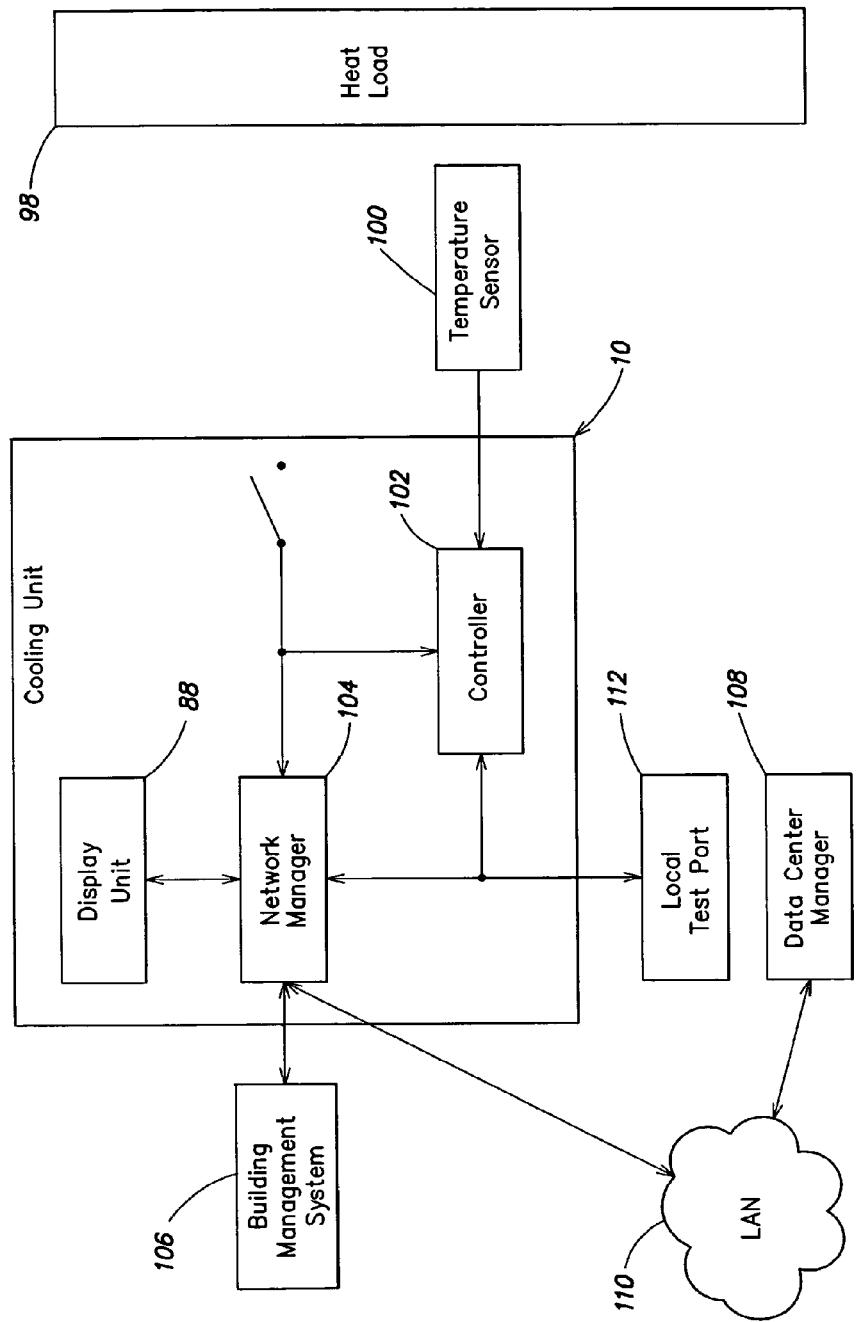
FIG. 7 is a system block diagram of the cooling unit of an embodiment of the invention.

FIG. 7 illustrates a system block diagram of the cooling unit 10, showing the major interfaces between the cooling unit and potential external devices. As shown, a heat load 98 is applied to the cooling unit 10 in which a temperature sensor 100 detects and transmits a signal to an embedded controller 102 of the cooling unit. In one embodiment, the embedded controller 102 may be a Philips XAG49 microprocessor (running at 16 MHz, 512 Kbytes of flash memory, 128 Kbytes of battery backed static RAM, 16 Kbytes of EEPROM, and having a real-time clock). As shown, the embedded controller 102 may communicate with a network manager 104 by means of a CAN, for example. The network manager 104 may communicate with the display unit 88, a building management system 106, if provided, a data center manager 108 by means of a local area network 110 (LAN), for example, or a local test port 112. In a certain embodiment, the network manager may employ a network management card containing ASIC, 4 Mbytes of static RAM, 16 Kbytes of EEPROM, a real time clock and a CAN controller. In one embodiment, the ASIC includes an Intel 186 microprocessor, running at 50 MHz, and a 10/100 Base-T network interface controller (NIC).

Figure 8:
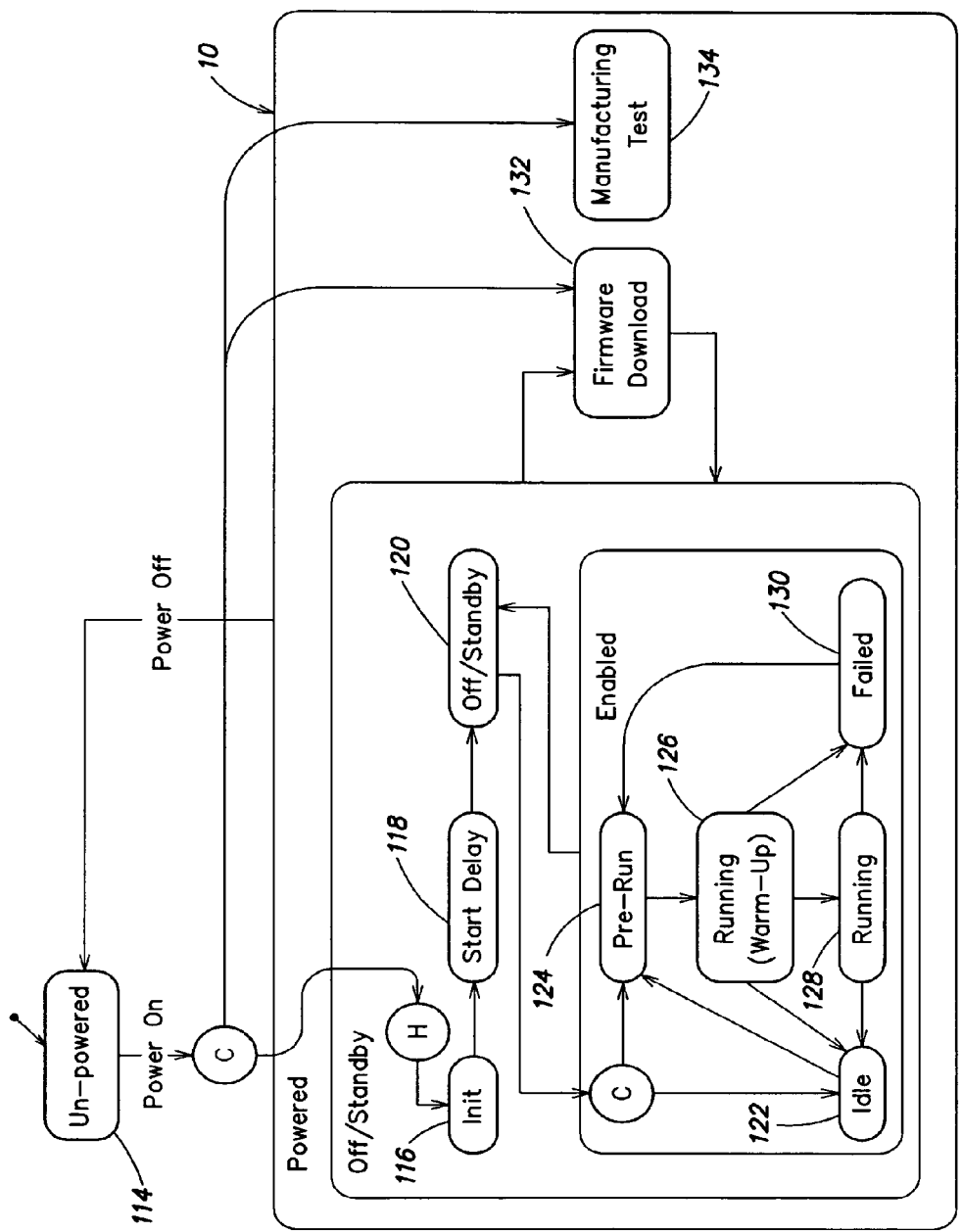
FIG. 8 is a system block diagram of the operational states and modes of the cooling unit.

During operation, the cooling unit 10 may be configured to function between several states, including, but not limited to, a main operational state, a condensate state and a hot gas bypass valve state. In the main operational state, which is illustrated in FIG. 8, the operation of the cooling unit proceeds as follows: (a) un-powered; (b) start-up delay; (c) off/standby; (d) idle operation; (e) failed operation; (f) warm-up operation; (g) running operation; (h) firmware download; and (i) test. Specifically, once power is provided, the cooling unit operationally moves from an un-powered condition at 114 to an initial powered condition at 116 in which initialized state variables are set. Once initialized, the cooling unit moves to a start-up delay condition at 118 in which no action is taken. After a predetermined time period (as determined by a delay timer, for example) and the synchronization of a stepper motor, the cooling unit transitions to an off/standby condition at 120 in which the hot gas bypass valve is fully opened. In this condition, the temperature and discharge pressure threshold alarms are disabled (except when employing a rack containment system, wherein only the temperature threshold alarms are disabled) and the fan speeds (evaporator and condenser) are set to idle (except when employing a rack containment system or when the machine is in proportional spot configuration mode wherein the fans are kept running at a minimum speed). In the off/standby mode 120, the cooling unit 10 is ready for operation.

As shown, the mode of operation may transition from either the off/standby condition 120 or an idle operation mode 122 to a pre-run operation mode at 124. The transition occurs if all of the following conditions are met: (1) the delay timer is not running; (2) the device has been commanded upon by the controller; (3) the suction and discharge pressures are equalized; (4) there is no idle requested due to a leak; and (5) the cooling unit inlet temperature, when employing in-row or air containment configurations, or return air temperature, when employing a spot cooling configuration, exceeds a predetermined cool set point and a dead band (i.e., a tolerance that prevents the unwanted transition to back to off/standby or idle modes). The transition to pre-run operation mode 124 may also occur when the forgoing transition does not occur, and the device has been commanded upon the controller. When in idle operation mode 122, the transition may also occur when (1) the delay timer is not running, (2) the suction pressure is above a predetermined threshold, e.g., 92 psig, (3) the condensate pan is not full, (4) there is no idle requested due to a leak, (5) the line pressure has equalized, and (6) the cooling unit inlet temperature (for in-row or containment configurations) or return air temperature (for spot cooling configurations) exceeds the predetermined cool set point and dead band.

During pre-run mode 124, the hot gas bypass valve is fully closed to clear any events that are no longer active. The temperature and discharge pressure threshold alarms are enabled and the evaporator and condenser fans are operated at full (maximum) speed. A delay timer is set for a predetermined time period, e.g., twenty seconds. When warming up at 126, the cooling unit is providing environmental control functionality in which the compressor is running. In this state, the evaporator and condenser fans are run at full (maximum) speed and the bypass valve is closed to allow the system to warm up and stabilize prior to attempting to control the system. Once warmed up, the cooling unit may be operated at 128 to provide the cooling operation described above. If failure occurs, which is indicated at 130 in FIG. 8, at either at the pre-run 124, warm-up 126 or running 128 modes, the pre-run routine 124 may be started again. The cooling unit may be further configured to conduct firmware download operations at 132 and manufacturing testing at 134, either during operation, or while powering up.

Transition to idle mode 122 may occur when upon one of the following events: (1) the condensate pan is full; (2) if there is an idle requested due to leak; (3) when employing a spot cooling configuration, the return air temperature is less than or equal to the cool set point; (4) when employing an in-row or containment system configurations, the cooling unit inlet temperature is below a cool set point, e.g., 90° F.-sec; (5) if high head pressure input is asserted (and not the third such event in thirty minutes); or (6) suction pressure is below a predetermined threshold, e.g., 92 psig (and not the third such event in thirty minutes). Transition from either warm-up mode 126 or running mode 128 to failure mode 130 may occur when the cooling unit is commanded upon by the controller and an analog sensor has failed, or there were three high head pressure events in thirty minutes, for example, or there were three low suction pressure events in thirty minutes, for example.

In one embodiment, transition from failure mode 130 to pre-run mode 124 may occur when all of the following conditions are met: (1) the cooling unit is commanded upon by the controller; (2) the delay timer is not running; (3) the condensate pan is not full; (4) no analog sensors have failed; (5) the three high head pressure in thirty minutes event is cleared, for example; and (6) the three low suction pressure in thirty minutes event is clear, for example. Transition back to off/standby mode 120 may occur when the unit is commanded upon by the controller. Transition from warm-up mode 126 to idle mode 122 may occur upon one of the following events: (1) if the condensate pan is full; (2) there is an idle requested due to leak; (3) when in discrete mode, the return air temperature is less than or equal to the cool set point, or, when in proportional mode, the rack inlet temperature is below the cool set point for 90° F.-sec, for example; or (4) if the high head pressure input is asserted and it is not the third such event in thirty minutes.

Figure 9:
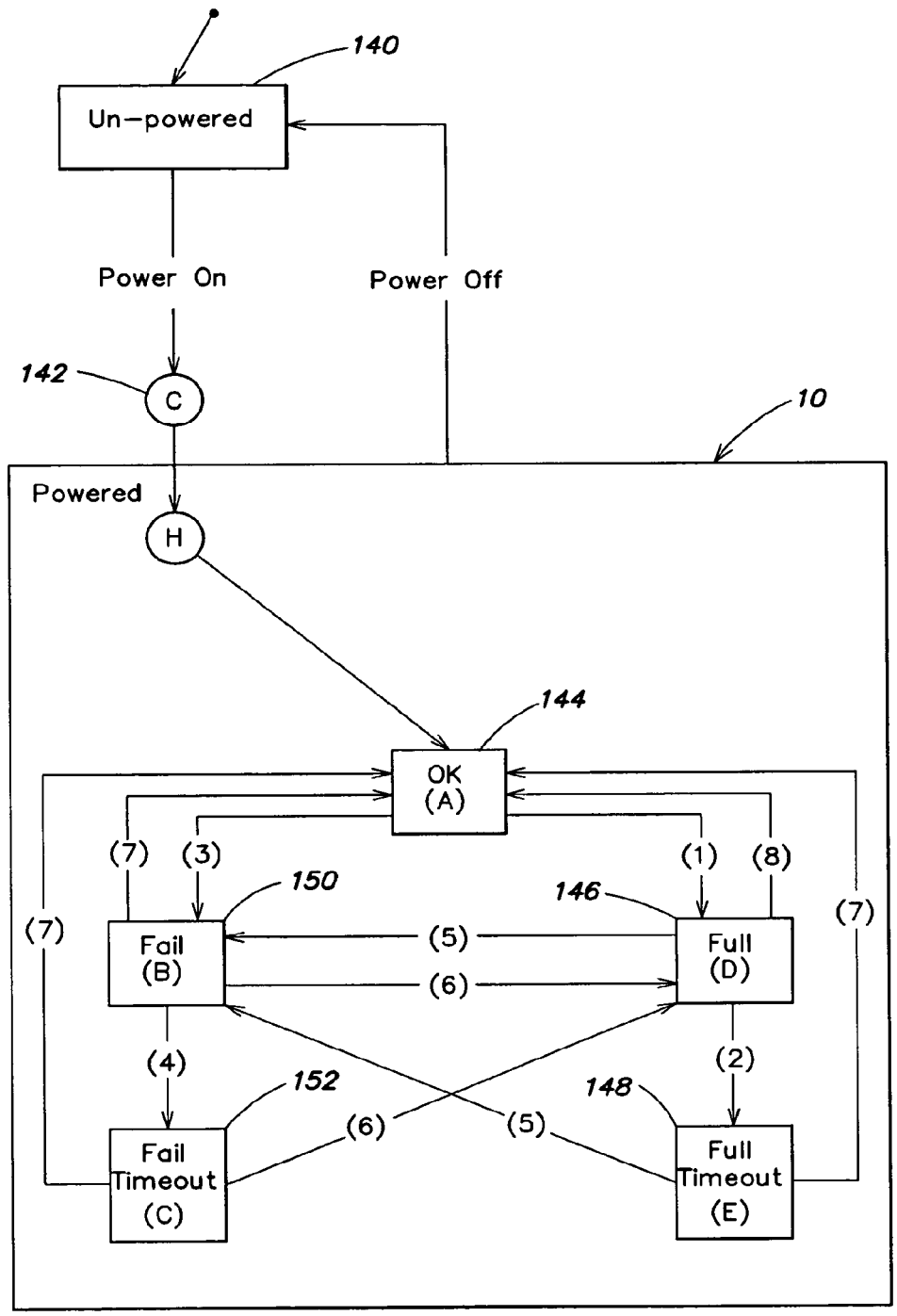
FIG. 9 is a system block diagram of the condensate state.
Figure 10:
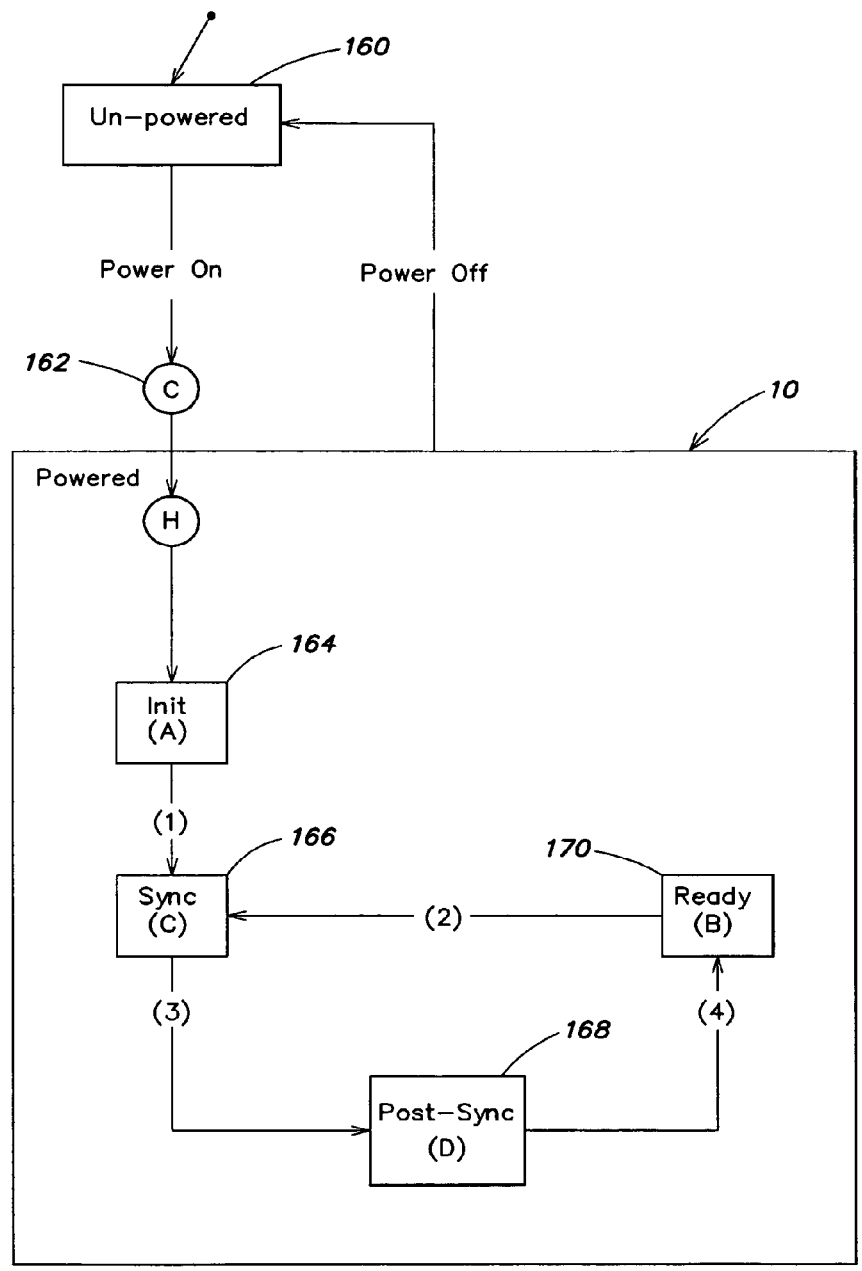
FIG. 10 is a system block diagram of the hot gas bypass valve state.

Referring to FIGS. 9 and 10, the condensate state mode is illustrated in FIG. 9 and the hot gas bypass valve state mode is illustrated in FIG. 10. With particular reference to FIG. 9, when referencing the condensate state, the cooling unit transitions from an un-powered condition at 140 to a powered condition at 142. Once powered on, a normal condensate level is indicated at 144. When the condensate pan becomes full, the condition of the cooling unit transitions from the normal mode 144 to a full mode 146. When in full mode 146, a signal may be transmitted to the controller or some other visual or audible alarm to discharge the condensate pan. When a predetermined period of time expires, e.g., ten minutes, the state of the cooling unit transitions to a full timeout mode at 148. All other failures are indicated at 150 in FIG. 9. For example, fail mode 150 may be triggered when a sensor, e.g., a float sensor, fails to deliver a signal to the controller. As with mode 148, upon the expiration of a predetermined period of time, e.g., ten minutes, the state of the cooling unit transitions to a full timeout mode at 152. The failures indicated at 146, 148, 150 and 152 may be cured in which the cooling unit returns to its normal state at 144.

With reference to FIG. 10, when referencing the hot gas bypass valve state, the cooling unit transitions from an un-powered condition at 160 to a powered condition at 162. Once powered on, a command is issued (e.g., by the controller or network manager) to the bypass valve to a synchronize closed position at 164 in which a delay timer is set. Once synchronized, indicated at 166 in FIG. 10, the cooling unit transitions to a post-synchronized mode at 168 in which the bypass valve is reset to a position where it was before synchronization, if commanded by the controller or network manager. Upon a predetermined delay as determined by the delay timer, for example, the mode transitions from 168 to a ready mode at 170 in which the bypass valve position is recorded and re-commanded to synchronize. From this position, the cooling unit transitions back to mode 166 in which the bypass valve receives a command to synchronize. This command may include how long to keep the bypass valve closed and whether to return the valve to the previous position after synchronization.

While operating, the cooling unit 10 is configured to provide the system operator with the ability to set the operating environment to one of the following: spot cooling within a space; hot aisle cooling within a row of equipment racks; or rack air containment cooling, which is described in U.S. patent application Ser. Nos. 11/335,874, 11/335,856 and 11/335,901 discussed above. When configured for spot cooling, the controller may be selected to one of the following control methods: proportional control, which modulates the bypass valve and fan speeds at certain set points and dead bands; or discrete control (e.g., energy saving), which closes the bypass valve and the compressor runs when the return or remote air temperature at the cooling unit exceeds a certain threshold. When employing a remote air sensor in in-row configurations, the sensor is located adjacent the front of the rack. The compressor is turned off when the temperature at the cooling unit is less than or equal to the threshold temperature. When configured for hot aisle and cold aisle environments, the proportional control method may be employed. Similarly, when configured for rack air containment, the proportional control method may be used. When in operation, the cooling unit may be configured to protect and maximize the life of the compressor.

The controller and/or system manager of the cooling unit 10 may be configured to monitor and control other aspects of the cooling unit. For example, the controller and/or system manager may be configured to monitor and control power management, event management, user interfaces, testing requirements, condensate monitoring, leak monitoring, run hour counters, maintenance alarms, fault alarms and user inputs and outputs.

Specifically, with certain prior art cooling systems, the compressor has a tendency to cycle on and off during operation, thereby creating a situation in which hot air flows from the hot aisle to the cold aisle since the evaporator fans are operating when the compressor is turned off. As discussed above, in order to address unwanted cycling of the compressor, the cooling unit 10 includes the bypass valve 64 and evaporator fans 68. In a certain embodiment, the bypass valve 64 is an electronic expansion valve offered by Sporlan Division of Parker-Hannifin Corporation of Washington, Mo. The temperature of air entering into the lower module 12 may be monitored and used as a set temperature. Cooling capacity control may be achieved in one of three modes. They are: (1) spot-proportional mode (e.g., in a data closet); (2) in-row mode (e.g., in hot aisle/cold aisle applications within a data center); and (3) rack air containment systems (RACS; e.g., in enclosed systems having at least one equipment rack and at least one cooling unit).

In circumstances where the cooling load is minimal, the temperature of the air entering the cooling unit 10 may drop so that the temperature approximates the unit's set temperature. In circumstances where the air temperature entering into the lower module 12 approaches the set temperature, the cooling unit's cooling capacity is reduced by bypassing hot gas back to the evaporator 44 with the bypass valve 64 via conduit 66. There are two methods used to reduce (or regulate) the cooling unit's cooling capacity. They are: (1) use of the hot gas bypass valve; and (2) use of the variable evaporator fan speed and the hot gas bypass valve together.

In another embodiment, by reducing the speed of the evaporator fans, the capacity of the cooling unit 10 is reduced. This results in the reduction of supply air temperatures, with the bypass valve regulating supply air temperature in proportional mode. Specifically, in a particular embodiment, the default supply air set point in spot-proportional modes may be 57° F. In another particular embodiment, the default supply air set point in in-row and containment air system mode may be 68° F., which is the minimum air temperature according to ASHRAE standards. As discussed above, the temperature sensor e.g., sensor 60, installed within the system adjacent the input of the compressor 30 may monitor the return gas temperature of coolant entering into the compressor. To keep the return coolant less than a predetermined temperature (e.g., 68° F.) so as to ensure the protection of the compressor 30, the bypass valve 64 may be throttled and the evaporator fan speed may be reduced, even when there is a demand for coolant bypass.

Under certain circumstances, while the bypass valve 64 bypasses hot gas coolant, coolant velocities within the pipes are reduced. This reduction of coolant velocities may limit the ability of compressor oil contained within the coolant from returning to the compressor 30. As is well known, a predetermined amount of oil may be provided in the coolant to protect the working components of the compressor 30. In a certain embodiment, the bypass valve 64 may be configured to close for a short period of time, e.g., approximately ten seconds, every twenty minutes or so when the bypass valve is operating in an open position. By closing the bypass valve 64 periodically for a short duration, relatively high coolant velocities may be achieved within the pipes so that any oil trapped within the pipes is forced back to the compressor 30.

During operation, low evaporating temperatures may be encountered in systems in which the filter drier 46 or an air filter become clogged, thus reducing the cooling capacity of the cooling unit 10. Low evaporating temperatures may reach a critical condition and cause damage to the compressor 30 by virtue of liquid coolant entering into the compressor. In one embodiment, to alleviate this potential concern, the evaporator fans 68 of the cooling unit 10, as discussed above, may embody multiple (e.g., three) variable speed, DC fans that work with the pressure transducer 62 located adjacent the accumulator 58. The pressure transducer 62 is configured to obtain an evaporating pressure reading of the coolant entering into the compressor 30. In one example, when the evaporating temperature drops below a predetermined temperature, e.g., 40° F., for example, as detected by the pressure transducer 62, a saturation temperature of the coolant is determined from a look up table embedded in the firmware of the controller. The temperature sensor 60 measures return gas temperature flowing to the compressor 30. The cooling unit 10 will increase evaporator air flow rate by increasing the speed of the evaporator fans 68 via a program control loop (e.g., a PID control loop) written in the firmware of the controller. If increasing the evaporator air flow rate (by increasing evaporator fan speed) does not result in the increase of the evaporating coolant temperature, and the temperature drops below a second predetermined temperature, 37° F., for example, the bypass valve 64 will bypass coolant hot gas to increase the evaporating temperature. The controller may be configured to trigger an alarm if the evaporating temperature drops below a third predetermined temperature, e.g., 34° F.

Conversely, the cooling unit 10 of embodiments of the invention may also be configured to address the issue of high return coolant gas temperatures entering into the compressor 30 as a result of high heat loads in the data center or equipment room. Such high temperatures may reduce the life of the compressor 30 or cause compressor damage if prolonged. In one embodiment, the cooling unit 10 may be configured so that the temperature sensor 60 adjacent the compressor 30 detects coolant temperature entering the compressor. When the coolant gas temperature reaches a predetermined temperature, e.g., 68° F., the controller may reduce the evaporator air flow by decreasing the speed of the evaporator fan speed 68 via a control loop (e.g., a PID loop) written in the firmware of the controller.

In certain environments, it may be difficult to control the air temperature entering the condenser through the intake opening 70 when the data center or equipment room includes a dropped ceiling or when hoses or ducts are used to move air to ambient since there is no temperature control within a dropped ceiling configuration. This restriction may result in low air temperatures being exerted on the condenser 34 and thus low coolant temperatures being generated by the condenser. In certain conditions, extremely low condensing temperatures may cause the coolant to flood back to the compressor 30 in liquid condition and damage the compressor. In one embodiment, the condenser fans 86 may embody three variable speed DC condenser fans that operate in cooperation with the pressure transducer 36 adjacent the condenser 34. In other embodiments, the condenser fans may be AC with VFD or SC PSC with a sine wave chopper. The condensing temperature may be calculated from readings taken from the pressure transducer 36 or from the temperature sensor. The controller may be configured to maintain the temperature above a predetermined temperature, e.g., 95° F., for example, by a control loop (e.g., a PID loop) written in the firmware of the controller. In another embodiment, the discharge pressure of coolant discharged by the condenser 34 through discharge pipe 42 may be monitored to control the condenser fans 86 speed. Specifically, a discharge pressure set point, e.g., 420 psig, may be achieved by regulating the fan speed by a control loop (e.g., a PID loop).

Conversely, when the air temperature in the dropped ceiling (or in situation in which a flexible hose supplies air to the condenser via intake opening 70, which may reduce the flow rate of air to the condenser) is higher than a predetermined temperature, e.g., above 100° F., for example, a resulting elevated condensing pressure may occur. This may result in a high pressure cutout switch 38 cutting off power to the compressor 30, thus causing total loss of cooling. In one embodiment, the condensing pressure may be measured by the pressure transducer 36. For example, the cooling unit 10 may be configured so that the high pressure cutout switch 38 cuts off the power to the compressor 30 when the condensing pressure reaches a predetermined pressure, e.g., 550 psig. In one method (in spot-discrete mode), if the condensing pressure reaches a predetermined pressure, e.g., 520 psig, the bypass valve 64 opens and bypasses the coolant to the evaporator 44 via conduit 66. The coolant reduced mass flow rate to the condenser 34 reduces the heat rejection and the condensing pressure is prevented from reaching the predetermined cutoff pressure. While a slight pressure drop in the system may result, the cooling unit 10 is still operating to provide the requisite cooling. In another method (in spot-proportional, in-row and rack air containment applications), if the condensing pressure reaches a predetermined pressure, e.g., 520 psig, the speed of the evaporator fans 68 is reduced to reduce the cooling capacity and heat rejection in the condenser which will assist in reducing the discharge pressure. The bypass valve 64 may also be manipulated to increase or decrease the discharge pressure. Reducing evaporator air flow will reduce the supply air temperature, which is regulated by the bypass valve.

Figure 11:
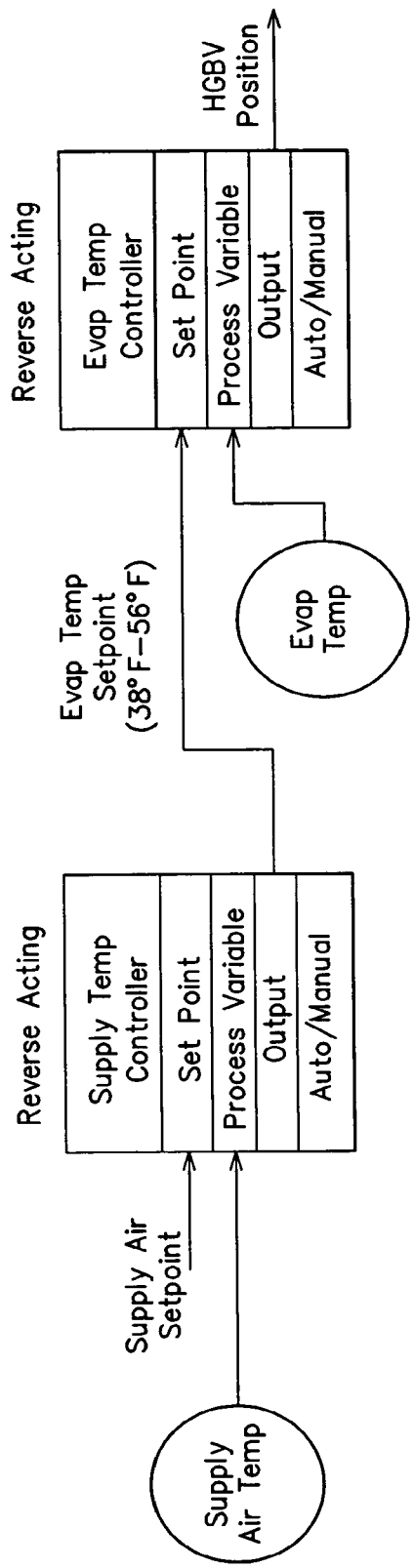
FIG. 11 is a system block diagram of the hot gas bypass valve control.

As discussed above, in certain embodiments, the following control strategies may be employed when in running mode, e.g., mode 128 in FIG. 8. When controlling the bypass valve in discrete capacity control mode, the bypass valve is normally held closed. If the discharge pressure exceeds a certain threshold, e.g., 520 psig, the bypass valve is opened linearly to a maximum of fifty percent at an elevated predetermined pressure, e.g., 550 psig. With reference to FIG. 11, when controlling the bypass valve in proportional capacity control mode, the bypass valve is regulated by a PID controller, for example, to (1) maintain the evaporating temperature within a safe range, e.g., between 38° F. and 56° F., and (2) maintain the supply air temperature at the predetermined, user-configurable supply air set point, e.g., between 52° F. and 73° F.

Figure 12:
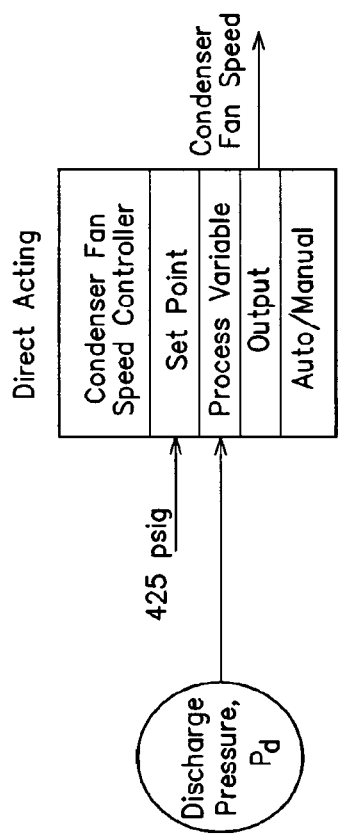
FIG. 12 is a system block diagram of the condenser fans speed control.
Figure 13:
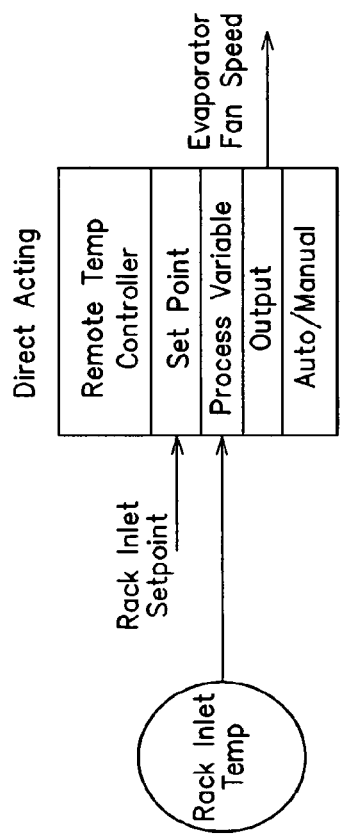
FIG. 13 is a system block diagram of the evaporator fans speed control.

In certain other embodiments, and with reference to FIG. 12, in all modes (discrete capacity and proportional capacity modes), the condenser fans speed may be regulated by a PID controller to maintain a predetermined discharge pressure, e.g., 425 psig. Similarly, with reference to FIG. 13, the evaporator fans speed, in discrete capacity mode, the evaporator fans are normally run at a constant speed. The user may specify the evaporator fans speed by setting the preferences within the controller user interface, e.g., the display unit. Specifically, in one embodiment, the user may select one of five fan speeds when in spot-discrete mode, e.g., high, medium-high, medium, medium-low and low. In other embodiments, the fan may be configured to operate in any number of fan speeds. In addition, if the suction discharge temperature exceeds a predetermined limit, e.g., 68° F., the evaporator fans speed may be lowered linearly to a minimum of fifty percent of their normal speed at a predetermined temperature, e.g., 75° F., for example. In proportional capacity control mode, which may be employed in spot cooling or in-row configurations, the evaporator fans speed may be regulated by a PID controller to maintain the cooling rack inlet temperature at a predetermined user-configurable set point. Additionally, the evaporator fans speed may be scaled down to alleviate certain abnormal conditions. Specifically, the evaporator fans speed may be post-scaled under the following conditions. When detecting high head pressure, the evaporator fans speed may be scaled one hundred percent up to a predetermined discharge pressure, e.g., 520 psig, down to a minimum of sixty-five percent at an elevated predetermined temperature, e.g., 550 psig, for example. The rate of the scaling may be configured to be linear. When detecting high suction temperature, the evaporator fans speed may be scaled one hundred percent up to a predetermined suction temperature, e.g., 68° F., down to a minimum of fifty percent at an elevated predetermined temperature, e.g., 75° F., for example. As with high head pressure detection, the rate of the scaling factor may be configured to be linear. Should high head pressure and high suction temperature abnormalities be detected simultaneously, the numerically lowest scaling factor may be used to scale the evaporator fans speed.

In a particular embodiment having a proportional capacity control configuration or in an air containment configuration, the evaporator fans speed may be controlled by employing the following equation:

$$T_R = ((Q_{actual} * 3415)/(CFM_{actual} * 1.08)) + T_S \quad (1)$$

where
$T_R$—theoretical return air temperature;
$Q_{actual}$—actual power output in Watts;
$CFM_{actual}$—airflow through the evaporator in cubic feet per minute;
$T_S$—supply air temperature in ° F.;
3415—converts kW to BTU per hour; and
1.08—power constant.

Next, the theoretical air return temperature may be averaged with the actual air return temperature by using the following equation:

$$T_R = T_R + T_{Ractual} \quad (2)$$

Next, the power demand for the air containment system is calculated by using the following equation:

$$Q_{DMD} = (\Delta T * CFM_{actual} * 1.08)/3415 \quad (3)$$

where
$Q_{DMD}$—power demand;
$\Delta T = T_R - T_{setp}$;
$T_{setp}$—supply air set point in ° F.; and
$CFM_{actual}$—airflow through the evaporator in cubic feet per minute.

Next, the air containment system airflow demand is calculated by employing the following equation:

$$CFM_{DMD} = (Q_{DMD} * 3415)/(\Delta T_{set} * 1.08) \quad (4)$$

where
$CFM_{DMD}$—air containment system airflow power demand; and
$\Delta T_{set}$—desired temperature delta across the cooling unit.

And finally, the desired evaporator fans speed may be calculated by employing the following equation:

$$\text{Speed percent} = (CFM_{DMD}/1200) * 100 \quad (5)$$

where
Speed percent—evaporator fans speed; and
1200—maximum airflow in cubic feet per minute.

Based on the foregoing manipulation of the condenser fans and the evaporator fans, the cooling unit 10 may be configured to optimize its cooling capacity. Specifically, cooling capacity may be calculated by the following equation:

$$\text{Cooling Capacity} = \text{Compressor Cooling Capacity} - \text{Evaporator Fan Heat} - \text{Latent Cooling} \quad (6)$$

The controller and the components of the cooling unit 10 may be configured, by employing a polynomial equation having coefficients unique to the compressor 30, coolant evaporating temperature and coolant condensing temperature. Specifically, for each cooling unit 10 used in the data center or equipment room, the compressor 30 has a set of coefficients to calculate cooling output, mass flow rate, energy efficiency rating, and current draw. Each set may consist of up to ten coefficients, and as a result, the compressor cooling capacity may be calculated by firmware provided in the controller. The coolant pressures are measured by the pressure transducers, and evaporating and condensing temperatures may be calculated from the coolant evaporating and condensing pressures and/or by temperature sensors.

Net Sensible Cooling Calculation Using ARI-540 Compressor Cooling Capacity Coefficients In one embodiment, to determine cooling capacity based on the fundamental equation (6), the cooling capacity may be determined by employing the following equation:

$$P_c = (Q_{comp} - Q_{comp\,loss} - 1052.6 * C_R * 0.2928104 - P_f)/1000 \quad (7)$$

where
$P_c$—net sensible cooling capacity;
$Q_{comp}$—compressor performance;
$Q_{comp\,loss}$—compressor heat loss;
1052.6—amount of energy required to condense one pound of water;
$C_R$—condensate production rate;
0.2928104—converts BTU/hour to Watts; and
$P_f$—fan power.

Figure 14:
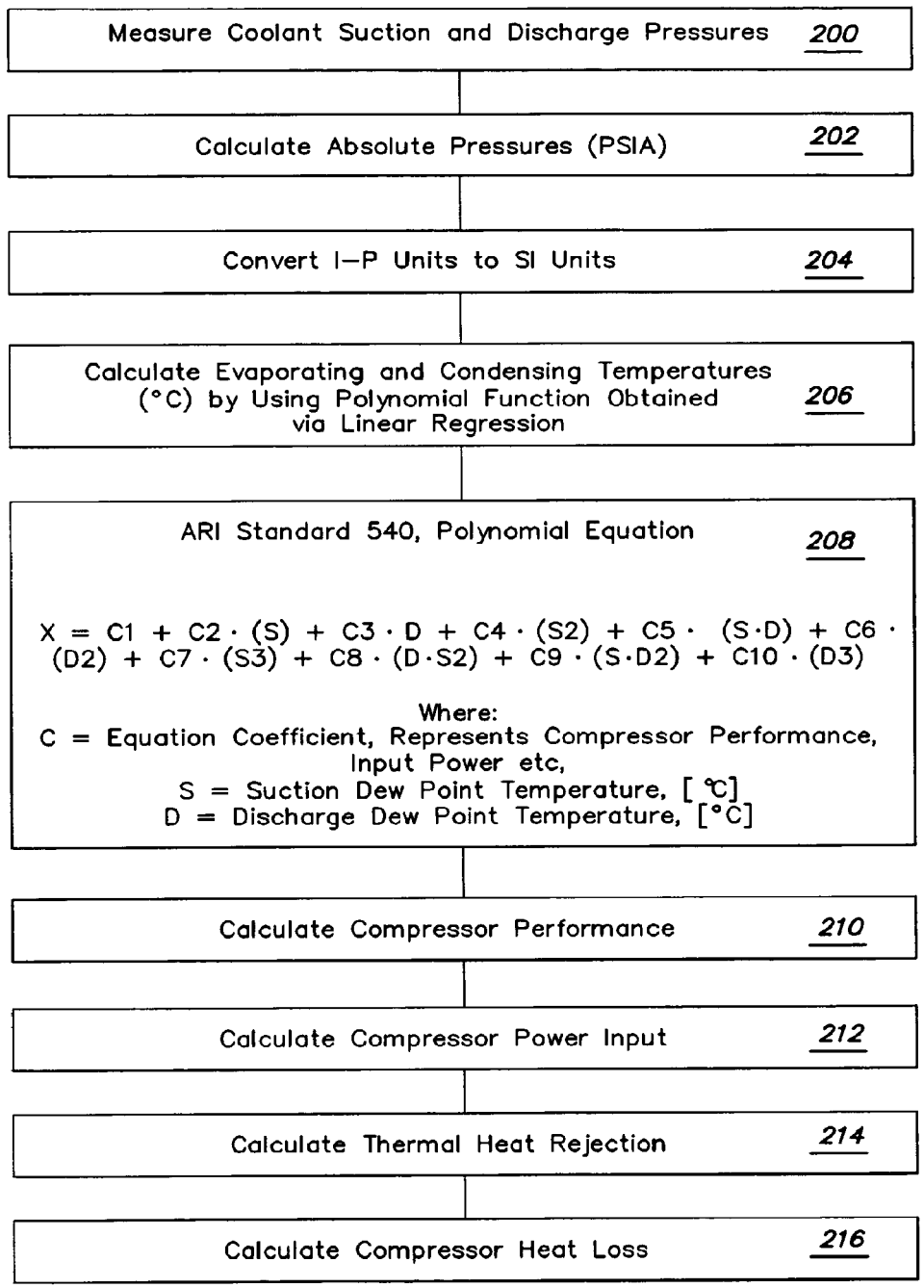
FIGS. 14-18 are flow charts showing the calculation of cooling capacity using equations of embodiments of the invention.

Equation (7) relies on industry-standard ARI-540 compressor cooling coefficients. Specifically, and with reference to FIG. 14, when employing equation (7), the coolant pressure at the pressure transducers is measured in psig at 200 and manipulated to calculate the absolute coolant suction and discharge pressures (by adding 14.7 psi to the gauge pressures) at 202. The pressure measurements are next converted from I-P units to SI units at 204. At 206, the coolant evaporating and condensing temperatures may be calculated. At 208, the ARI-540 polynomial equation may be calculated as follows:

$$X = C1 + C2*(S) + C3*D + C4*(S2) + C5*(S*D) + C6*(D2) + C7*(S3) + C8*(D*S2) + C9*(S*D2) + C10*(D3) \quad (8)$$

Where
X—can be (1) compressor capacity, (2) coolant mass flow rate, (3) compressor input power or current, (4) or energy efficiency ratio (EER);

C—equation coefficient representing compressor performance;

S—suction dew point temperature in ° C.; and

D—discharge dew point temperature in ° C.

Next, at 210, the compressor performance ($Q_{comp}$) may be calculated by inserting selected compressor performance coefficients (in SI units) to the ARI-540 polynomial equation (8). At 212, the compressor power input may be calculated by inserting selected power coefficients (in SI units) to the ARI-540 polynomial equation (8). Based on these calculations, the thermal heat rejection component may be calculated at 214 in Watts by adding $Q)_{comp}$ and $P_{comp}$. And finally, at 216, the compressor heat loss may be calculated. Based on the results obtained above, the cooling capacity of the cooling unit may be determine. It should be noted that the compressor coefficients may be provided in both metric (SI) and English units. When taking Celsius (° C.) temperature readings for evaporating and condensing temperatures, the compressor coefficients are represented in metric units. When taking Fahrenheit (° F.) readings for evaporating and condensing temperatures, the compressor coefficients are represented in English units. It should further be noted that if the compressor is not in the evaporator air stream, the $Q_{comp\,loss}$ component of equation (7) is omitted.

Example

Using polynomial equation (7), which employs ARI-540 polynomial equation (8), the capacity of a cooling unit may be calculated as follows. Equation (8) is employed, assuming the following coefficients identified in Table 1 for a cooling unit using a 60 Hz compressor:

TABLE 1

| Coefficient | Compressor Cooling Capacity |
| --- | --- |
| C1 | 2.206E+04 |
| C2 | 3.403E+02 |
| C3 | −2.265E+02 |
| C4 | 4.067E+00 |
| C5 | −8.068E−01 |
| C6 | 1.352E+00 |
| C7 | 1.309E−02 |
| C8 | −1.900E−02 |
| C9 | −2.813E−03 |
| C10 | −3.881E−03 |

The following estimated values for fan power, condensate production rate and compressor heat loss may be assumed:

$P_f$—300 Watts;

$C_R$—1.6 pounds/hour; and $Q_{comp\,loss}$—150 Watts.

And finally, the following test measurements may be employed for determining the coolant suction and discharge dew point temperatures:

Evaporating Pressure—136 psig;

Discharge Pressure—438 psig;

Suction Dew Point Temperature—47.1° F.; and

Discharge Dew Point Temperature—123.9° F.

Based on the foregoing, cooling capacity is calculated as follows:

$Q_{comp}$=6393 Watts $P_c$=(6393−150−1052.6*1.6*0.2928104−300)/1000

$P_c$=5.45 kW

Net Sensible Cooling Calculation Using Unit Supply and Return Air Temperatures

In another embodiment, the cooling capacity of the cooling unit may be determined by employing the following equation:

$$P_c = ((SCFM*0.075*60)*C_p*DT_{air}/3.415 - Q_{comp\,loss} - P_f)/1000 \tag{9}$$

where $P_c$—net sensible cooling capacity;

1000—converts Watts to Kilowatts;

$C_p$—specific heat of air in BTU/lb-° F.;

$Q_{comp\,loss}$—compressor heat loss;

$DT_{air}$—supply and return air temperature difference;

SCFM—estimated standard volume flow rate at given fan speeds 0.075—density of standard air in lb/ft³; and $P_f$—fan power.

Figure 15:
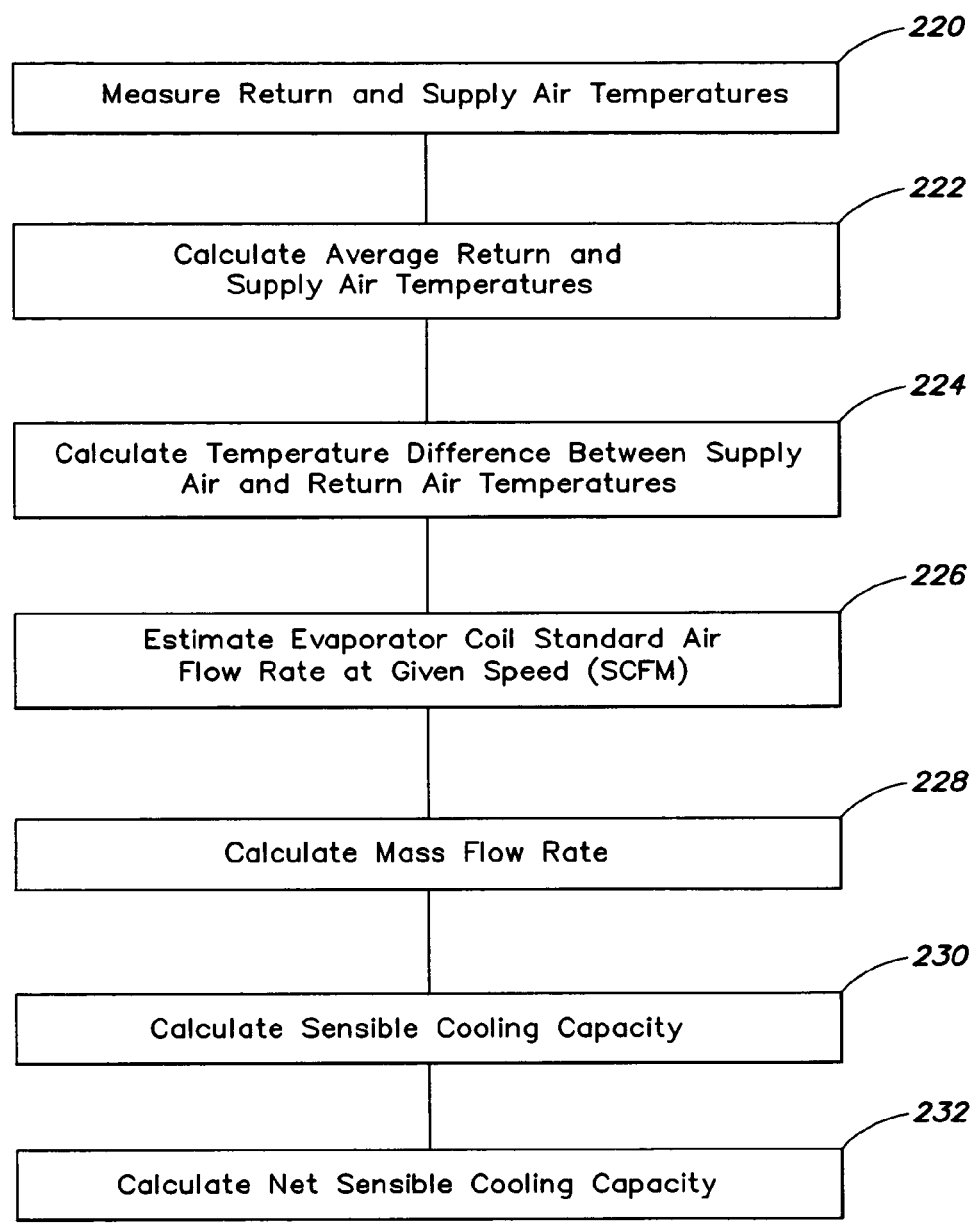

With reference to FIG. 15, at 220, the return and supply air temperatures of the cooling unit are measured. Next, at 222, the average return and supply temperatures are determined At 224, the temperature differential ($DT_{air}$) is calculated based on the average return and supply temperatures. At 226, the evaporator coil standard air flow rate at a given speed is calculated to determine SCFM, assuming a specific heat $C_p$ at 0.243 BTU/lb-° F. The mass flow rate may be calculated at 228, followed by the calculation of sensible cooling capacity at 230 and 232.

Net Sensible Cooling Calculation Using Condenser Coil Heat Rejection

In yet another embodiment, cooling capacity of the cooling unit may be determined by using the following equations:

$$Q_{thr} = (SCFM*0.075*60)*C_p*DT_{air}/3.415 \tag{10}$$

$$Q_{comp} = Q_{thr} - P_{comp} \tag{11}$$

$$P_c = (Q_{comp} - 1052.6 C_R * 0.2928104 - C_{comp\,loss} - P_f)/1000 \tag{12}$$

where $Q_{thr}$—heat rejection at condenser coil;

$P_c$—net cooling capacity;

$Q_{comp}$—compressor performance;

$Q_{comp\,loss}$—compressor heat loss;

1052.6—amount of energy required to condense one pound of water;

0.2928104—converts BTU/hour to Watts;

$P_f$—fan power;

$C_R$—condensate production;

$C_p$—specific heat of air;

$DT_{air}$—condenser entering and leaving air temperature difference;

$P_{comp}$—compressor power consumption;

1000—converts Watts to Kilowatts;

SCFM—estimated standard volumetric flow rate at given fan speeds; and 0.075—density of standard air.

Figure 16:
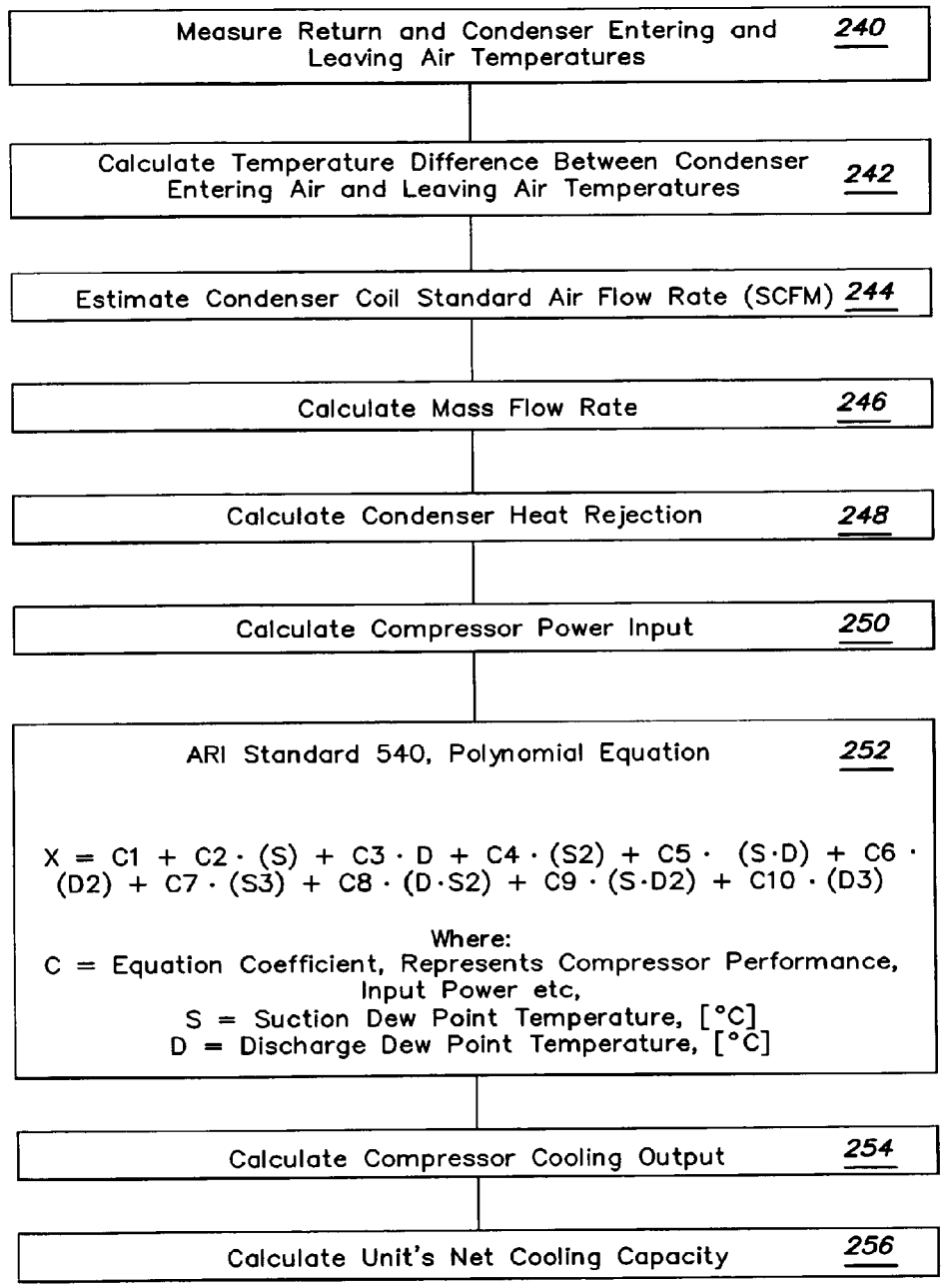

Referring to FIG. 16, the method of calculating cooling capacity with equations (10)-(12) is as follows. At 240, the temperature of air entering into and exiting out of the condenser is measured. At 242, the temperature differential between the air entering into and exiting out of the condenser is calculated to arrive at $DT_{air}$. Next, at 244, the condenser coil standard flow rate (SCFM) is estimated, assuming a specific heat ($C_p$) of 0.243 BTU/lb-ft. At 246, the mass flow rate (in lb/hr) is calculated. At 248, the condenser heat rejection is calculated and converted to watts by dividing the result by 3.415. The compressor power input is calculated by inserting selected compressor power input coefficients (in SI units) at 250 to the ARI-540 polynomial equation (8) at 252. At 254 and 256, the compressor cooling output and the cooling capacity is calculated, respectively. With respect to the cooling capacity, the latent capacity, fan heat and compressor heat loss are subtracted from the compressor cooling output to determine the sensible cooling capacity.

Net Sensible Cooling Calculation Using ARI-540 Compressor Refrigerant Mass Flow Rate Coefficients In yet another embodiment, the cooling capacity may be determined by utilizing the following equations:

$$P_c = (Q_{total} - Q_{comp\ loss} - 1052.6 * C_R * 0.2928104 - P_f)/1000 \quad (13)$$

$$Q_{total} = M * (h_{suction\ gas} - h_{liquid}) \quad (14)$$

where
- $P_c$—net sensible cooling capacity;
- $Q_{total}$—total cooling capacity;
- $Q_{comp\ loss}$—compressor heat loss;
- 1052.6—amount of energy required to condense one pound of water;
- $C_R$—condensate production;
- 0.2928104—converts BTU/hr to Watts;
- $P_f$—fan power;
- 1000—converts Watts to Kilowatts;
- $Q_{total}$—total cooling capacity;
- M—coolant mass flow rate;
- $h_{suction\ gas}$—enthalpy of coolant at evaporator coil outlet; and
- $h_{liquid}$—enthalpy of coolant at thermostatic expansion valve inlet.

Figure 17:
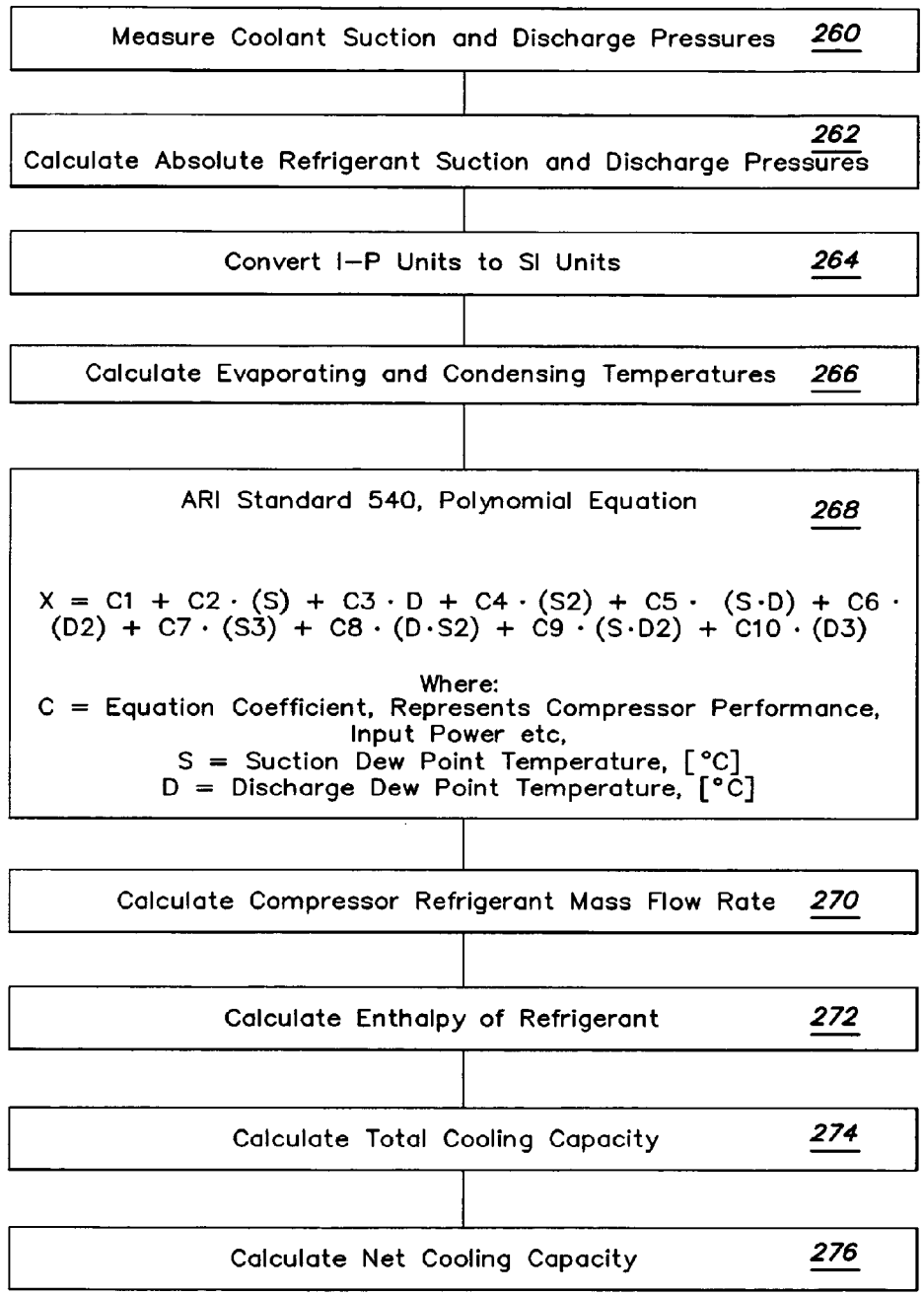

Turning to FIG. 17, at 260, coolant gauge suction and discharge pressures are measured at the suction and discharge pipes. At 262, absolute coolant suction pressure (otherwise referred to as evaporating pressure) and discharge pressure (otherwise referred to as condensing pressure) are calculated by adding 14.7 psi to the gauge pressures obtained in 260. At 264, the units are converted to SI units. Next, at 266, dew point evaporating and condensing temperatures are calculated. At 268, the ARI-540 polynomial equation (3) is employed. At 270, the compressor coolant mass flow rate is calculated by inserting selected compressor performance coefficients. At 272, enthalpies of the coolant at the thermostatic expansion valve inlet and evaporator coil outlet are calculated by using coolant pressures and temperatures. And finally, at 274 and 276, the total cooling capacity and the net cooling capacity may be determined Net Sensible Cooling Calculation Using AR-540 Compressor Refrigerant Mass Flow Rate Coefficients with Electronic Hot Gas Bypass Valve In a further embodiment, the cooling capacity may be determined by employing the following equations:

$$P_c = (Q_{total} - Q_{comp\ loss} - 1052.6 * C * 0.2928104 - P_f)/1000 \quad (15)$$

$$Q_{total} = M * (h_{suction\ gas} - h_{mix\ evaporator\ inlet}) \quad (16)$$

$$h_{mix\ evaporator\ inlet} = (M_{bypass} * h_{hot\ gas} + (M - M_{bypass}) * h_{liquid})/M \quad (17)$$

where
- $P_c$—net sensible cooling capacity (kW);
- $Q_{total}$—total cooling capacity (W);
- $Q_{comp\ loss}$—compressor heat loss (W);
- C—condensate production rate (lbs/hr);
- $P_f$—fan power (W);
- M—refrigerant mass flow rate calculated via using ARI-540 mass flow rate coefficients (kg/sec);
- $h_{suction\ gas}$—enthalpy of the gas refrigerant at evaporator coil inlet (W/kg);
- $h_{mix\ evaporator\ inlet}$—enthalpy of the mixed refrigerant at evaporator coil inlet (W/kg);
- $M_{bypass}$—refrigerant mass flow rate bypassed through bypass valve (kg/sec);
- $h_{hot\ gas}$—enthalpy of the hot gas refrigerant at compressor outlet (W/kg);
- $h_{liquid}$—enthalpy of the liquid refrigerant at expansion valve inlet (W/kg);
- 1052.6—amount of energy required to condense one pound of water;
- 0.2928104—converts BTU/hour to Watts; and
- 1000—converts Watts to Kilowatts Instead of relying on industry-standard ARI-540 compressor cooling coefficients as with equation (7), equation (15) may be employed when the hot gas bypass valve is open. Equation (7) may be used when the hot gas bypass valve is closed; however, this equation produces unreliable results when the hot gas bypass valve is open. To calculate cooling capacity when the hot gas bypass valve is open, the refrigerant flow rates and the enthalpy values are needed to calculate the cooling unit's total coolant capacity. In one embodiment, the mass flow rate may be determined by using readings taken from the suction and discharge pressure sensors and by employing the formula provided in Table 3 below. In another embodiment, two additional pressure sensors may be positioned adjacent to the inlet and the outlet of the hot gas bypass valve 64 to measure the flow rate through the hot gas bypass valve.

As stated above with reference to equation (6), the net sensible cooling is equal to the total cooling less latent cooling less heat loss associated with the fan and other equipment. In order to calculate the fan heat loss, the following assumptions identified in Table 2 may be utilized:

TABLE 2

| Fan Speed | Heat Loss (Fan and Misc.) |
|---|---|
| 100 | 1037 |
| 95 | 914 |
| 90 | 799 |
| 85 | 723 |
| 80 | 674 |
| 75 | 638 |
| 70 | 605 |
| 65 | 574 |
| 60 | 548 |
| 55 | 509 |
| 50 | 469 |
| 45 | 437 |
| 40 | 406 |
| 35 | 375 |
| 30 | 346 |
| 25 | 324 |

The compressor mass flow rate may be calculated by using the compressor mass flow rate ARI-540 coefficients and the refrigerant evaporating and condensing saturation temperatures. For example, the coefficients identified in Table 1 may be employed when using a 60 Hz compressor. Specifically, the following polynomial equation may be used:

$$M_{Comp} = \{C1 + C2*(TE) + C3*(TC) + C4*(TE)^2 + \\ C5*(TE)*(TC) + C6*(TC)^2 + C7*(TE)^3 + \\ C8*(TE)^2*(TC) + C9*(TE)*(TC)^2 + C10*(TC)^3\} \quad (18)$$

Where
- $M_{Comp}$—compressor refrigerant mass flow rate (lb/min);
- TE—evaporating temperature (° F.); and
- TC—condensing temperature (° F.).

First order formulas may be created for the following hot gas bypass valve openings: 7.5%, 10%, 15%, 20%, 25%, 30%, 40%, 50%, 60%, 70%, 80%, 90% and 100%. Flow of refrigerant through the hot gas bypass valve may start at 7.5% open.

Using Table 3, the mass flow rate of refrigerant flowing through the hot gas bypass valve may be calculated as follows:

TABLE 3

| HGBV Percent (%) | Opening Steps | Formula $M_{HGBV}$ [lb/m] |
|---|---|---|
| 7.5 | 120 | $(0.0221998 * PD + 3.83034) * M_{comp}/100$ |
| 10 | 160 | $(0.0395686 * PD + 8.78194) * M_{comp}/100$ |
| 15 | 239 | $(0.0974769 * PD + 8.94475) * M_{comp}/100$ |
| 20 | 319 | $(0.0952355 * PD + 15.2806) * M_{comp}/100$ |
| 25 | 399 | $(0.108888 * PD + 15.6116) * M_{comp}/100$ |
| 30 | 479 | $(0.126575 * PD + 14.4788) * M_{comp}/100$ |
| 40 | 638 | $(0.12971 * PD + 18.8012) * M_{comp}/100$ |
| 50 | 798 | $(0.148736 * PD + 21.7109) * M_{comp}/100$ |
| 60 | 958 | $(0.141607 * PD + 28..5625) * M_{comp}/100$ |
| 70 | 1117 | $(0.127498 * PD + 35.1903) * M_{comp}/100$ |
| 80 | 1277 | $(0.157793 * PD + 29.5813) * M_{comp}/100$ |
| 90 | 1436 | $(0.114126 * PD + 46.1506) * M_{comp}/100$ |
| 100 | 1596 | $(0.135256 * PD + 43.7494) * M_{comp}/100$ |

Based on the foregoing, the suction gas enthalpy value may be calculated by using the following formula:

$$H_{Suction} = 0.0833088 * T_{Suction} + 119.474 \quad (19)$$

Where $H_{Suction}$—suction gas refrigerant enthalpy (Btu/lb); and
$T_{suction}$—suction gas temperature (° F.).

The liquid refrigerant enthalpy value may be calculated by using the following formula:

$$H_{Liquid} = 0.0833088 * T_{Liquid} + 119.474 \quad (20)$$

Where $H_{Liquid}$—liquid refrigerant enthalpy (Btu/lb); and
$T_{Liquid}$—liquid refrigerant temperature (° F.).

The hot gas refrigerant enthalpy value may be calculated by using the following formulas below:

when the hot gas bypass valve is open less than 50%, or when the hot gas bypass valve is open more than 50% and the pressure difference between condensing and evaporating pressures is less than 220 psi, then $$H_{hg} = 0.036414 * P_{condensing} + 124.276 \quad (21)$$

when the hot gas bypass valve is open more than 50% and the pressure difference is more than 220 psi $$H_{hg} = 0.036414 * P_{condensing} + 124.276 - 1.5 \quad (22)$$

Where $H_{hg}$—hot gas refrigerant enthalpy value (psi); and
$P_{condensing}$—discharge or condensing pressure (psig).

Figure 18:
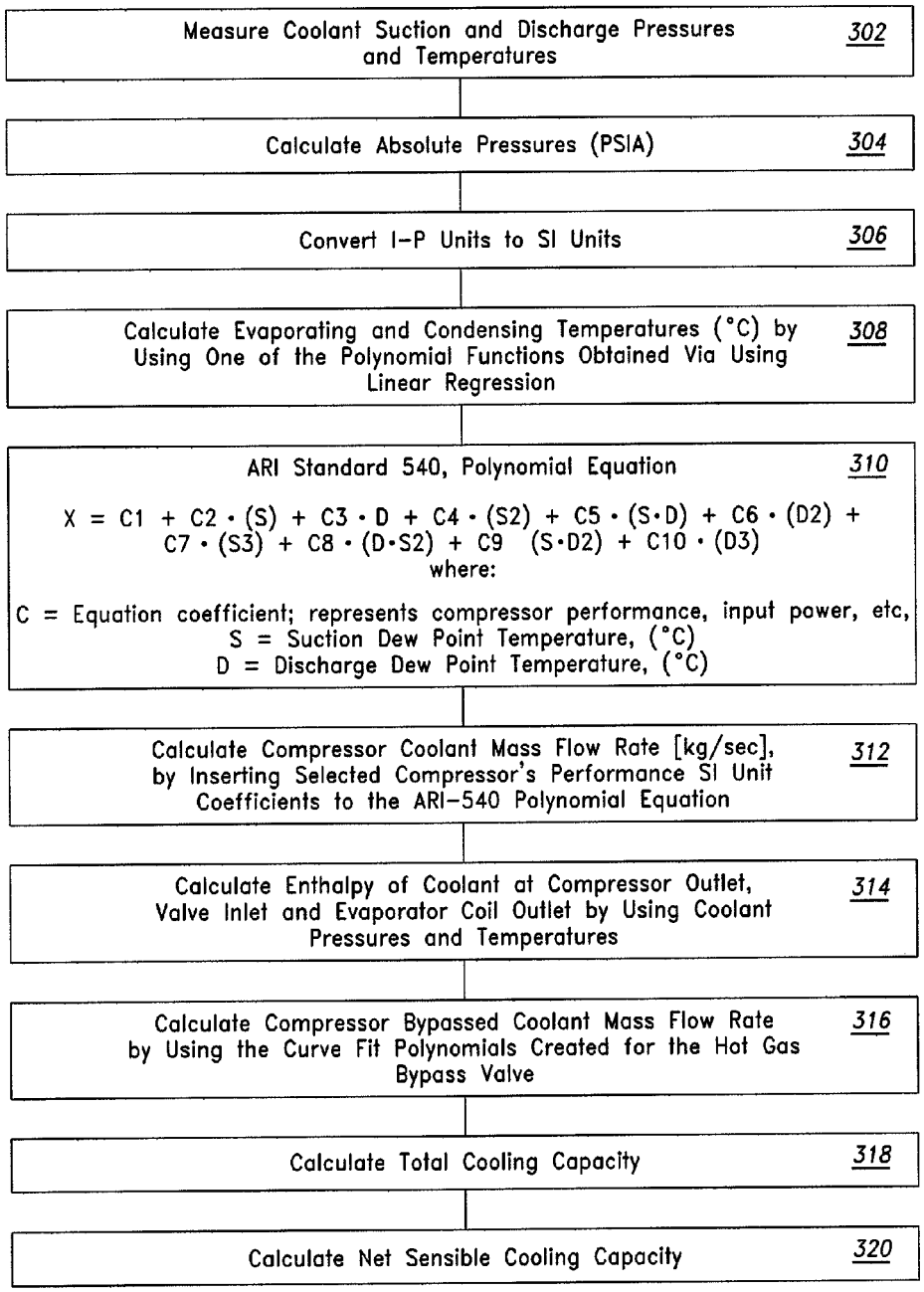

With reference to FIG. 18, a method of calculating net sensible cooling capacity is generally indicated at 300. As shown, at 302, the refrigerant gauge suction, liquid and discharge pressures and temperatures are measured. At 304, the absolute refrigerant suction and discharge pressures are calculated by adding 14.7 psi to the gauge pressures. At 306, the IP units are converted to SI units (1 psi=6.8948 kPa). Next, at 308, the refrigerant dew evaporating and condensing temperatures are calculated by using one of the polynomial functions obtained by using linear regression. For example, at step 310, the polynomial equation (8) may be employed to calculate the dew evaporating and condensing pressures. Next at 312, the refrigerant mass flow rate [kg/sec] may be calculated by inserting selected compressor performance SI unit coefficients. At 314, the enthalpy of the refrigerant at the compressor outlet and the valve inlet and the evaporator coil outlet may be either obtained or calculated by using the refrigerant pressures and temperatures. At 316, the compressor bypassed refrigerant mass flow rate may be calculated by using the curve fit polynomials created for the hot gas bypass valve. There may be a curve fit polynomial for different valve openings. At 318, the total cooling capacity may be calculated by using equation (16). And finally, at 320, the net sensible cooling capacity of the cooling unit may be calculated by using equation (15).

In one embodiment, the method 300 illustrated in FIG. 18 may be performed by an InRow® SC cooling unit offered by American Power Conversion Corporation of West Kingston, R.I. The InRow SC cooling unit may be particularly suited for smaller applications, such as for server rooms and wiring closets. In another embodiment, the method 300 may be performed by an InRow RC cooling unit, which is also offered by American Power Conversion Corporation. The InRow RC cooling unit, which may embody cooling unit 10, may be a row-based, chilled water cooling solution for medium to large data centers including high density applications. In other embodiments, the method 300 may be employed by any cooling unit that includes a hot gas bypass valve.

In a certain embodiment, the cooling unit may be configured to provide uninterruptible cooling. Specifically, it has been discovered that by bypassing coolant from high pressure hot gas side to low temperature to the pressure suction side before the discharge pressures reach the predetermined cutoff pressure, the coolant flow rate to the condenser is reduced to reduce the discharge pressure of coolant exiting the condenser. In certain applications in which air temperature entering the condenser coil is relatively high, e.g., 100° F. or higher, the blockage of air flow into the condenser may occur. This may result in very high condensing pressures that require the high pressure cutoff switch to activate thereby cutting off power to the compressor. Obviously, the exposure to elevated temperatures may result in damage to the electronic equipment housed in the equipment storage racks.

In one embodiment, the pressure transducer at the discharge pipe may be employed to measure pressure of coolant entering the condenser. As discussed above, the cooling unit may be provided with a pressure cutoff switch, such as switch 38, which cuts off the power when the condensing pressure reaches a predetermined pressure, e.g., 550 psig. If, for example, the condensing pressure reaches a threshold predetermined pressure, e.g., 525 psig, the cooling unit may be configured to have the bypass valve open to allow a portion of the high pressure coolant to return back to the condenser. The coolant mass flow rate to the condenser coil is reduced with the heat rejection and the condenser pressure is limited so that the pressure within the condenser is below 550 psig. As a result, there may be a drop in cooling capacity, but total loss of cooling may be prevented since the compressor remains in operation.

Thus, it should be observed that by controlling the speed of the condenser fans, the condensing pressure may be reduced as needed, extremely high or low evaporating temperatures may be avoided, and high suction temperatures to the compressor may be avoided. In addition, the capacity of the cooling unit may be controlled. By manipulating the hot gas bypass valve, the condensing pressure may be reduced to prevent the cooling unit from reaching a high threshold (cutoff) pressure, the evaporating temperature may be controlled and the air temperature may be controlled as well. Also, the hot gas bypass valve may be manipulated to open during a compressor "off cycle" to expedite the coolant pressure equalization for faster and quieter compressor restarts. By closing the hot gas bypass valve periodically, the delivery of coolant to the condenser may be increased to force the delivery of oil that may be trapped back to the compressor.

As discussed, the cooling unit 10 is modular and scalable so that a person designing a cooling system for the data center may select individual components. Specifically, depending on the electronic equipment deployed within the data center, and the optimum operating conditions required for the equipment, the person may employ any number of cooling units to provide primary or supplemental cooling to the particular data center. In one embodiment, the location of the cooling units within the room may be determined using a computer aided design tool. Reference is made to U.S. patent application Ser. No. 11/120,137, entitled "METHODS AND SYSTEMS FOR MANAGING FACILITY POWER AND COOLING," filed on Apr. 7, 2005 and U.S. Provisional Patent Application No. 60/719,356, entitled "METHODS AND SYSTEMS FOR MANAGING FACILITY POWER AND COOLING," filed on Sep. 22, 2005, which are assigned to the assignee of the present application and incorporated herein by reference. These applications generally disclose systems and methods for designing data centers and for managing equipment contained within the data center.

In one configuration, the cooling units may be packaged and shipped to the data center from a manufacturing or distribution facility. Once received, the cooling units may be assembled and otherwise installed within the data center. Specifically, the cooling units are suitably connected to a power source (not shown) and the controller to complete the installation.

As referenced above, in one embodiment, the controller may be a separately dedicated unit that controls the operation of one or more of the cooling units. In another embodiment, a main controller may be provided in one of the cooling units in place of one of the subservient controller units, with the cooling unit having the controller functioning as the main cooling unit and the other cooling units functioning as subservient cooling units. In yet another embodiment, the operation of the cooling unit may be under the control of an integrated data center control and monitoring system with each cooling unit rack having a controller that communicates with the other cooling units over the network. In one such embodiment, the controller may communicate with a data center control system to provide status of the components of the cooling system and to receive control commands for the data center control system. In one embodiment, each cooling unit includes a controller that communicates with the data center controller over a network, such as a CAN Bus network, and in one such embodiment, the data center controller may be implemented using the integrated data center control and monitoring system, such as the InfraStruXure™ data center manager sold by American Power Conversion Corporation of West Kingston, R.I., the assignee of the present invention.

In certain embodiments, the cooling unit may take the form of a kit for cooling a data center. Depending on the volume of space of the data center, the components of the kit are scalable to meet the cooling requirements of the data center. In one embodiment, the kit comprises a predetermined number of cooling units adapted to be interspersed within rows of equipment racks in the data center. The cooling units may embody the cooling unit described above.

Thus, it should be observed that cooling units of embodiments of the present invention are particularly configured for scalable and modular implementation within a data center. The cooling system may be provided in kit form that may be installed by personnel having no particular training in cooling system installation and no specialized tools. One benefit of the cooling unit is that it may be movable within a data center, or to another data center, when environmental conditions or needs within the data center change. Another advantage is that each cooling unit is self-contained, in that only power and communication needs to be delivered to each unit. No external cooling systems are required.

In addition, since the cooling unit may be provided as an in-row product, the cooling unit may be positioned to intake the hottest air in the data center and to cool it slightly below ambient temperature. This design feature eliminates the inefficiency of mixing hot air with the room temperature air to get a warm mixture. The design also significantly decreases latent cooling provided by the air conditioner, thereby potentially eliminating the need for humidification. The improvements to efficiency may best be seen by the fact that the foot print of a cooling unit (e.g., cooling unit 10) may be decreased (e.g., by up to thirty percent) to obtain the same cooling performance. Specifically, the provision of movable cooling units having casters and leveling feet improves the efficiency and the scalability of the cooling system. To assist the operator in optimizing the locations of the cooling units, the cooling capacity of each unit may be monitored by the operator, along with the flow rate, coolant and air inlet and outlet temperatures, and pressure differentials. These readings enable the operator to place the cooling units where each cooling unit may neutralize the maximum amount of heat, while providing higher flexibility to the operator in the room design and layout and removing the constraint of having air conditioners positioned around the periphery of the data center. From a power perspective, each cooling unit operates under direct current, thus providing some level of flexibility to the input power provided. Thus, a cooling unit no longer needs to be built for a specific voltage.

As described above, the cooling unit of embodiments of the invention may be further provided as part of an integrated data center control and monitoring system. When used with such an integrated control and monitoring system, the cooling unit is easily removable for service and relocation to another position within the data center. The cooling unit may also be integrated into an existing cooling system of the building housing the data center, for example and used in conjunction with one or more CRAC units to provide additional cooled air where needed in the data center.

The cooling unit may be provided with a predictive failure determination module by utilizing a number of factors. Specifically, through the controller, each cooling unit may be designed to notify the data center operator when certain parts, such as motors, fans, or any other part subject to wear, are near the ends of their useful life. The provision of such a module will enable a reasonably timed preventative maintenance action to be performed and to save possible downtime. The notification may be delivered to the display of the cooling unit, or provided to the operator of the data center through the integrated control and monitoring system. In addition, a controller of the cooling unit configured as a main controller may compensate for a failure of a particular cooling unit by increasing the output of other cooling units positioned near the failed cooling unit.

With the cooling unit of embodiments of the present invention, it is observed that the need for a raised floor is eliminated. By eliminating the raised floor, costs associated with designing and providing the raised floor are eliminated. In addition, the equipment housed by the equipment racks may be better anchored to the floor of the data center for enhanced earthquake resistance. The number of suitable sites for server rooms or data centers is increased because rooms with relatively low headroom may now be utilized. Additionally, the need for raised floor ramps is eliminated.

The cooling unit of embodiments of the present invention is faster to install than prior systems. Since the cooling unit includes a closed loop cooling system, only power and communication need be connected to the cooling unit. Thus, the data center looks more professional.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A method of operating a cooling system having one or more cooling units, the method comprising:
transitioning the operation of a cooling unit of the cooling system in a main operational state between one or more operational conditions, including an off/standby condition,
wherein after a predetermined time period and a synchronization of a stepper motor of the cooling unit to a closed position of a hot gas bypass valve, the cooling unit transitions to the off/standby condition in which the hot gas bypass valve of the cooling unit is fully opened,
wherein temperature and discharge pressure threshold alarms of the cooling unit are disabled and fan speeds of an evaporator and a condenser of the cooling unit are set to idle, and
wherein the cooling unit is ready for operation in the off/standby condition.

2. The method of claim 1 wherein the condition of operation transitions from either the off/standby condition or an idle operation condition to a pre-run operation condition provided the following conditions are met (1) a delay timer is not running, (2) the cooling unit has been commanded upon by a controller of the cooling system, (3) suction and discharge pressures of the cooling unit are equalized, (4) there is no idle requested due to a leak, and (5) an inlet temperature of the cooling unit, when employing in-row or air containment configurations, or return air temperature, when employing a spot cooling configuration, exceeds a predetermined cool set point and a dead band.

3. The method of claim 2, wherein the transition to the pre-run operation condition also occurs when the conditions are not, and the cooling unit has been commanded upon the controller.

4. The method of claim 2, wherein, during pre-run condition, the hot gas bypass valve is fully closed to clear any events that are no longer active.

5. The method of claim 4, wherein temperature and discharge pressure threshold alarms are enabled and evaporator and condenser fans are operated at full speed.

6. The method of claim 1, wherein, when in an idle operation condition, the transition may also occur when (1) a delay timer of the cooling unit is not running, (2) a suction pressure of the cooling unit is above a predetermined threshold, (3) a condensate pan of the cooling unit is not full, (4) there is no idle requested due to a leak, (5) a line pressure of the cooling unit has equalized, and (6) an inlet temperature of the cooling unit or return air temperature of the cooling unit exceeds a predetermined cool set point and dead band.

7. The method of claim 1, wherein, when warming up, the cooling unit provides environmental control functionality in which a compressor of the cooling unit is running.

8. The method of claim 7, wherein evaporator and condenser fans of the cooling unit are run at full speed and the bypass valve is closed to allow the cooling system to warm up and stabilize.

9. The method of claim 8, wherein, once warmed up, the cooling unit is operated to provide the cooling operation described above, and if failure occurs, a pre-run routine is initiated.

10. The method of claim 9, wherein the cooling unit is further configured to conduct firmware download operations and manufacturing testing, either during operation, or while powering up.

11. The method of claim 1, wherein transition to an idle operating condition occurs when upon one of the following events (1) the condensate pan is full, (2) if there is an idle requested due to leak, (3) when employing a spot cooling configuration, the return air temperature is less than or equal to the cool set point, (4) when employing an in-row or containment system configurations, an inlet temperature of a cooling unit of the cooling system is below a cool set point, (5) if high head pressure input is asserted, or (6) suction pressure is below a predetermined threshold.

12. The method of claim 11, wherein transition from either a warm-up condition or a running condition to a failed operation condition occurs when the cooling unit is commanded upon by a controller of the cooling system and an analog sensor has failed, or when a predetermined number of high head pressure events occur within a predetermined amount of time.

13. The method of claim 1, wherein transition from a failure condition to a pre-run condition occurs when all of the following conditions are met (1) the cooling unit is commanded upon by a controller of the cooling system, (2) a delay timer of the cooling unit is not running, (3) a condensate pan cooling unit is not full, (4) no analog sensors of the cooling unit have failed, (5) a high head pressure event is cleared, and (6) a low suction pressure event is clear.

14. The method of claim 1, wherein transition from a warm-up condition to an idle condition occurs upon one of the following events (1) if a condensate pan of the cooling unit is full, (2) there is an idle requested due to leak, (3) when in discrete condition, a return air temperature of the cooling unit is less than or equal to the cool set point, or, when in proportional condition, a rack inlet temperature of the cooling unit is below a cool set point, or (4) if a high head pressure input is asserted and has not exceeded a number of predetermined events with a predetermined amount of time.

15. The method of claim 1, wherein transitioning the operation of the cooling unit includes transitioning between one or more of the following operational conditions—
(a) an un-powered condition,
(b) a start-up delay condition,
(c) the off/standby condition,
(d) an idle operation condition,
(e) a failed operation condition,
(f) a warm-up operation condition,
(g) a running operation condition,
(h) a firmware download condition, and
(i) a test condition.

* * * * *